United States Patent
Kang et al.

(10) Patent No.: US 11,417,810 B2
(45) Date of Patent: Aug. 16, 2022

(54) LIGHT EMITTING DIODE DEVICE HAVING MULTILAYER FILTER FOR IMPROVING COLOR CHARACTERISTIC OF LIGHT

(71) Applicant: SAMSUNG ELECTRONICS CO., LTD., Suwon-si (KR)

(72) Inventors: Jihoon Kang, Suwon-si (KR); Jitsuo Ota, Suwon-si (KR); Jenghun Suh, Suwon-si (KR); Jaephil Shim, Seoul (KR); Myunghee Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/916,321

(22) Filed: Jun. 30, 2020

(65) Prior Publication Data

US 2021/0005797 A1     Jan. 7, 2021

(30) Foreign Application Priority Data

Jul. 3, 2019 (KR) .................. 10-2019-0080361

(51) Int. Cl.
*H01L 33/58* (2010.01)
*H01L 25/075* (2006.01)
(Continued)

(52) U.S. Cl.
CPC .......... *H01L 33/58* (2013.01); *H01L 25/0753* (2013.01); *H01L 27/1214* (2013.01);
(Continued)

(58) Field of Classification Search
CPC ..... H01L 33/58; H01L 33/0093; H01L 33/50; H01L 33/60; H01L 33/62; H01L 2933/0041; G02B 5/285
See application file for complete search history.

(56) References Cited

U.S. PATENT DOCUMENTS 8,896,004 B2   11/2014   Sakai et al.
10,401,557 B2   9/2019   Kim et al.
(Continued)

FOREIGN PATENT DOCUMENTS

CN    103149679 A    6/2013
JP    H10-98213 A    4/1998
(Continued)

OTHER PUBLICATIONS

Written Opinion (PCT/ISA/237) issued by the International Searching Authority in corresponding International Application No. PCT/KR2020/008216, dated Oct. 12, 2020.
(Continued)

*Primary Examiner* — Jay C Chang
*Assistant Examiner* — Mikka Liu
(74) *Attorney, Agent, or Firm* — Sughrue Mion, PLLC

(57) ABSTRACT

An LED device includes: a first semiconductor layer of a first type; a second semiconductor layer of a second type; a light emitting layer formed between the first semiconductor layer and the second semiconductor layer and configured to emit light; and a filter formed on the second semiconductor layer and configured to transmit light in the second wavelength band within the first wavelength band. The filter includes a defect layer, first refractive layers, and second refractive layers having a refractive index greater than a refractive index of the first refractive layers, the first refractive layers and the second refractive layers are formed alternately on one side and other side of the defect layer. A thickness of the defect layer is determined based on a center wavelength of the first wavelength band, a peak wavelength of the second wavelength band and a refractive index of the defect layer.

20 Claims, 19 Drawing Sheets

(51) Int. Cl.
  *H01L 27/12*  (2006.01)
  *H01L 33/00*  (2010.01)
  *H01L 33/60*  (2010.01)
  *H01L 33/62*  (2010.01)
  *H01L 33/50*  (2010.01)
  *G02B 5/28*  (2006.01)

(52) U.S. Cl.
  CPC .......... *H01L 33/0093* (2020.05); *H01L 33/50* (2013.01); *H01L 33/60* (2013.01); *H01L 33/62* (2013.01); *G02B 5/285* (2013.01); *H01L 2933/0041* (2013.01); *H01L 2933/0058* (2013.01)

(56) References Cited

U.S. PATENT DOCUMENTS

| | | |
|---|---|---|
| 2009/0001401 A1 | 1/2009 | Park et al. |
| 2011/0260188 A1* | 10/2011 | Choi ........................ H01L 33/46 257/98 |
| 2012/0025244 A1 | 2/2012 | Suh et al. |
| 2013/0021793 A1 | 1/2013 | Zimmerman et al. |
| 2014/0203292 A1 | 7/2014 | Hwang et al. |
| 2016/0087159 A1 | 3/2016 | Kim et al. |
| 2016/0349445 A1 | 12/2016 | Kim et al. |
| 2017/0062680 A1* | 3/2017 | Yoo ........................ H01L 33/60 |
| 2017/0090083 A1 | 3/2017 | Takishita et al. |
| 2018/0269191 A1 | 9/2018 | England et al. |

FOREIGN PATENT DOCUMENTS

| | | |
|---|---|---|
| JP | 2004-279933 A | 10/2004 |
| JP | 2008-52067 A | 3/2008 |
| JP | 4372440 B2 | 11/2009 |
| JP | 2016-4141 A | 1/2016 |
| KR | 10-2004-0082786 A | 9/2004 |
| KR | 10-2014-0050396 A | 4/2014 |
| KR | 10-2016-0141302 A | 12/2016 |
| WO | 2012/086888 A1 | 6/2012 |

OTHER PUBLICATIONS

International Search Report (PCT/ISA/210), issued by International Searching Authority in corresponding International Application No. PCT/KR2020/008216, dated Oct. 12, 2020.

Communication dated Mar. 18, 2022 issued by the European Patent Office in counterpart European Application No. 20834690.8.

* cited by examiner

- ΔWp = 10 nm
- Center Wp = 460 nm
- FWHM: 19 nm

· ΔWp = 2 nm
· Center Wp = 460 nm
· FWHM: 5 nm

LIGHT EMITTING DIODE DEVICE HAVING MULTILAYER FILTER FOR IMPROVING COLOR CHARACTERISTIC OF LIGHT

CROSS-REFERENCE TO RELATED APPLICATION(S)

This application is based on and claims priority under 35 U.S.C. § 119 to Korean Patent Application No. 10-2019-0080361, filed on Jul. 3, 2019, in the Korean Intellectual Property Office, the disclosure of which is incorporated by reference herein in its entirety.

BACKGROUND

1. Field

The disclosure relates to a light emitting diode (LED) device and a manufacturing method thereof, and more particularly, to an LED device capable of improving a color characteristic of light and a manufacturing method thereof.

2. Description of Related Art

In recent years, a semiconductor-based light emitting diode (LED) device has been put into practical use in various industries such as display and lighting industries because of high light-emitting efficiency. In particular, a micro LED (μ-LED) device, which has a long lifetime and may form an individual pixel, has been spotlighted as a next-generation light source. Here, the micro LED device may refer to the LED device having width, length and height of 1 to 100 micrometers (μm), respectively.

Meanwhile, an image displayed on a display apparatus may be formed by a plurality of pixels. Here, the pixel may be formed of sub-pixels representing red (R), green (G) and blue (B) colors, which are three primary colors of light. The pixel may express a variety of colors through an amount of light and a combination of colors of light represented by respective sub-pixels.

To this end, the micro LED device may be driven individually as a sub-pixel unit (or pixel unit) to emit light to implement the sub-pixel (or pixel). For example, in case that one micro LED device implements one sub-pixel, about 25 million micro LEDs may be required in an ultra high definition (UHD) standard (e.g., the number of pixels of 3840×2160).

SUMMARY

In accordance with an aspect of the disclosure, an LED device includes: a first semiconductor layer of a first type; a second semiconductor layer of a second type different from the first type; a light emitting layer formed between the first semiconductor layer and the second semiconductor layer and configured to emit light based on a difference between a voltage applied to the first semiconductor layer and a voltage applied to the second semiconductor layer; and a filter formed on the second semiconductor layer and configured to transmit light in the second wavelength band within the first wavelength band, wherein the filter includes a defect layer, a plurality of first refractive layers, and a plurality of second refractive layers having a refractive index greater than a refractive index of the first refractive layers, the plurality of first refractive layers and the plurality of second refractive layers are formed alternately with each other on one side and the other side of the defect layer, and the defect layer is formed in a thickness based on a center wavelength of the first wavelength band, a peak wavelength of the second wavelength band and a refractive index of the defect layer.

In accordance with an aspect of the disclosure, a manufacturing method of an LED device includes: sequentially forming, on a substrate, a first semiconductor layer of a first type, a light emitting layer emitting light and a second semiconductor layer of a second type different from the first type; removing the substrate; and forming a filter on a portion where the substrate is removed from the first semiconductor layer, the filter transmitting light in a second wavelength band within a first wavelength band, wherein the filter includes a defect layer, a plurality of first refractive layers, and a plurality of second refractive layers having a refractive index greater than a refractive index of the first refractive layers, the plurality of first refractive layers and the plurality of second refractive layers are formed alternately with each other on one side and the other side of the defect layer, and the defect layer is formed in a thickness based on a center wavelength of the first wavelength band, a peak wavelength of the second wavelength band and a refractive index of the defect layer.

Additional and/or other aspects and advantages of the disclosure are set forth in part in the description which follows and, in part, are obvious from the description, or may be learned by practice of the disclosure.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
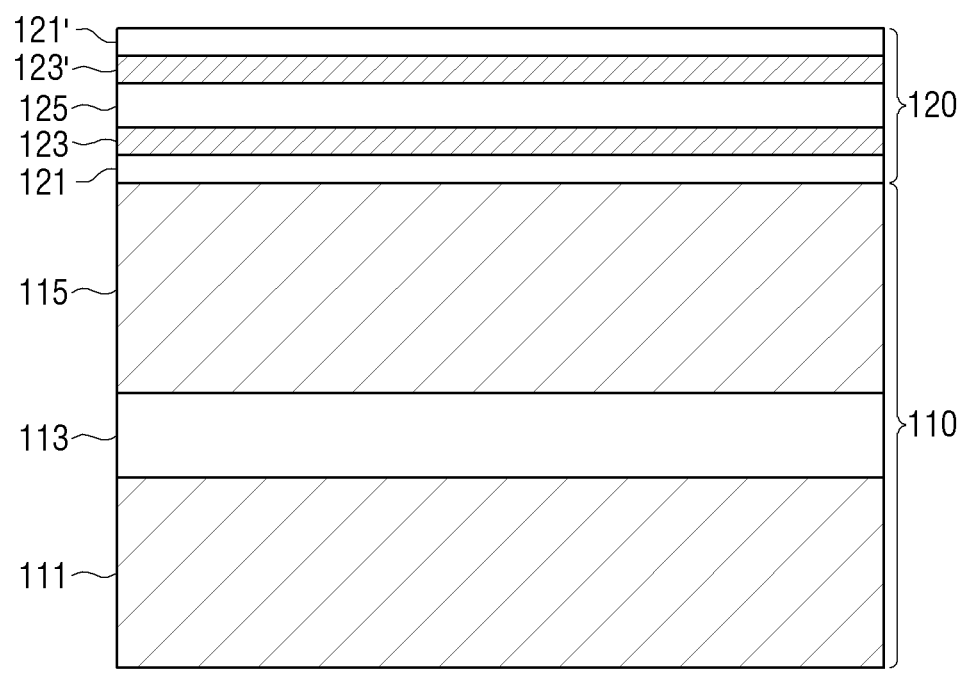
FIG. 1 is a view for describing an LED device according to an embodiment.

Embodiments provide an LED device capable of improving a color characteristic of light and a manufacturing method thereof.

In describing the disclosure, if it is decided that a detailed description for the known functions or configurations related to the disclosure may unnecessarily obscure the gist of the disclosure, its detailed description is omitted. In addition, the following embodiments may be modified in several different forms, and the scope and spirit of the disclosure are not limited to the following embodiments. Rather, these embodiments make the disclosure thorough and complete, and are provided in order to completely transfer the spirit of the disclosure to those skilled in the art.

It is to be understood that technologies mentioned in the disclosure are not limited to specific embodiments, but include all modifications, equivalents, and substitutions according to the embodiments of the disclosure. Throughout the accompanying drawings, similar components are denoted by similar reference numerals.

As used herein, the terms "1st" or "first", "2nd" or "second" or the like, may use corresponding components regardless of importance or order and are used to distinguish one component from another without limiting the components.

In the disclosure, an expression "A or B", "at least one of A and/or B", "one or more of A and/or B" or the like, may include all possible combinations of items enumerated together. For example, "A or B", "at least one of A and B" or "at least one of A or B" may indicate all of 1) a case in which at least one A is included, 2) a case in which at least one B is included or 3) a case in which both of at least one A and at least one B are included.

In the disclosure, expressions such as "x~y" and "x–y" may be interpreted to indicate "at least one value belonging to a range of x or more and y or less". (Here, x and y are numbers, respectively).

In the disclosure, singular forms include plural forms unless the context clearly indicates otherwise. It is further understood that a term 'include' or 'formed of' used in the specification specifies the presence of features, numerals, steps, operations, components, parts or combinations thereof, which is mentioned in the specification, and does not preclude the presence or addition of one or more other features, numerals, steps, operations, components, parts or combinations thereof.

Meanwhile, various elements and regions in the drawings are schematically illustrated. Therefore, the spirit of the disclosure is not limited by relative sizes or intervals illustrated in the accompanying drawings.

Hereinafter, diverse embodiments of the disclosure are described in detail with reference to the accompanying drawings.

FIG. 1 is a view for describing an LED device according to an embodiment.

Referring to FIG. 1, an LED device 100 according to an embodiment may include a first semiconductor layer 111, a light emitting layer 113, a second semiconductor layer 115 and a filter 120.

The LED device 100 may refer to a semiconductor device configured to emit light. For example, the LED device 100 may be implemented as an inorganic semiconductor-based micro LED device or a mini LED device. Here, the micro LED device may refer to a semiconductor light emitting device having width, length and height of 1 to 100 micrometers (μm), respectively; and the mini LED device may refer to a semiconductor light emitting device having width, length and height of 100 to 200 micrometers (μm), respectively.

The first semiconductor layer 111 may include a first type semiconductor, and the second semiconductor layer 115 may include a second type semiconductor different from the first type. Here, the first type and the second type may refer to different ones of an n-type semiconductor and a p-type semiconductor. For example, in case that the first semiconductor layer 111 of the first type is the n-type (or p-type) semiconductor, the second semiconductor layer 115 of the second type may be the p-type (or n-type) semiconductor. In this case, the n-type semiconductor may refer to a semiconductor in which a free electron is used as a carrier for transferring electric charge, and the p-type semiconductor may refer to a semiconductor in which a hole is used as the carrier for transferring the electric charge.

The light emitting layer 113 may be configured to emit light based on a difference between a voltage applied to the first semiconductor layer 111 and a voltage applied to the second semiconductor layer 115. To this end, the light emitting layer 113 may be formed between the first semiconductor layer 111 and the second semiconductor layer 115. Here, the light emitting layer may refer to an active layer formed on an interface formed by a junction of the n-type semiconductor and the p-type semiconductor. In addition, the light emitting layer 113 may be formed of a single-quantum well structure (SQW) or a multi-quantum well structure (MQW).

Meanwhile, the first semiconductor layer 111, the light emitting layer 113 and the second semiconductor layer 115 may form a semiconductor cell 110.

Figure 3A:
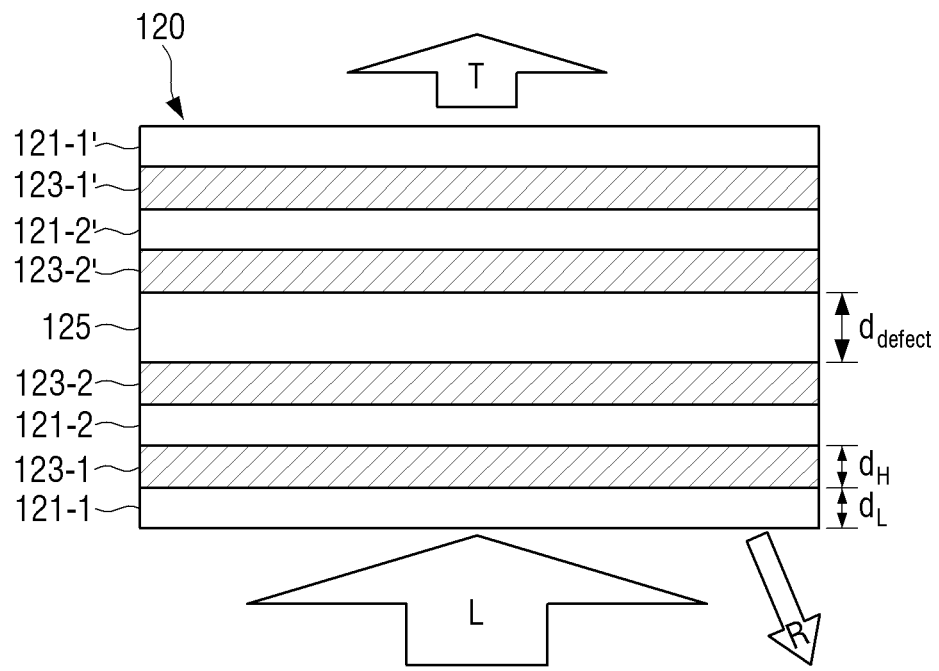
FIG. 3A is a view for describing a structure of a filter according to an embodiment.
Figure 3B:
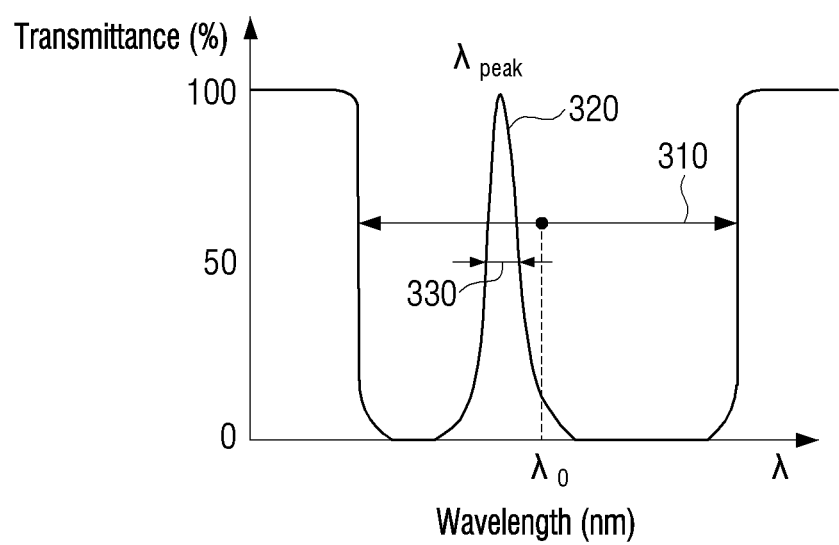
FIG. 3B is a view for describing a light characteristic of a filter according to an embodiment.

The filter 120 may be configured to transmit light in a second wavelength band 330 (see FIG. 3B) within a first wavelength band 310 (see FIG. 3B). For example, the filter 120 may transmit light in the second wavelength band 330 within the first wavelength band 310 and may not transmit the other light by reflecting or absorbing light in a wavelength band other than the second wavelength band 330 within the first wavelength band 310.

Here, the first wavelength band 310 may include a prohibited band or a prohibited transmission region through which light is not transmitted and the second wavelength band 330. Here, the second wavelength band 330 may refer to a pass band through which light is transmitted within the first wavelength band 310.

To this end, the filter 120 may be formed on the second semiconductor layer 115. In detail, the filter 120 may be formed on a surface of the semiconductor cell 110 from which light is extracted in consideration of a path through which light emitted from inside the semiconductor cell 110 is extracted to the outside. In the disclosure, it is assumed that light emitted from the light emitting layer 113 in the semiconductor cell 110 is extracted to the outside through the second semiconductor layer 115. Therefore, the filter 120 may be formed on the second semiconductor layer 115.

In addition, the filter 120 may include a plurality of first refractive layers 121 and 121', a plurality of second refractive layers 123 and 123' and a defect layer 125. Hereinafter, for convenience of explanation, the plurality of first refractive layers 121 and 121' are respectively referred to as the first refractive layers 121, and the plurality of second refractive layers 123 and 123' are respectively referred to as second refractive layers 123.

The first refractive layers 121 may have a refractive index smaller than that of the second refractive layers 123. That is, the second refractive layers may have a refractive index greater than a refractive index of the first refractive layers. Here, the refractive index may refer to a rate at which a speed of light is decreased in case that light is moved (progressed) to another medium.

The plurality of first refractive layers 121 and 121' and the plurality of second refractive layers 123 and 123' may be formed alternately with each other on one side and the other side of the defect layer 125. Here, one side of the defect layer 125 may refer to a bottom surface of the defect layer 125 and the other side of the defect layer 125 may refer to a top surface of the defect layer 125. In addition, the alternation of the first and second refractive layers 121 and 123 may refer to one pair of the first and second refractive layers 121 and 123 or a periodical repetition of one pair of the first and second refractive layers 121 and 123.

The defect layer 125 is an intermediate layer positioned inside the filter 120 and may be formed between the plurality of first refractive layers 121 and 121' and the plurality of second refractive layers 123 and 123'. Meanwhile, a thickness of the defect layer 125 may be determined based on a center wavelength of the first wavelength band 310, a peak wavelength of the second wavelength band 330 and a refractive index of the defect layer 125. Here, the center wavelength of the first wavelength band 310 may refer to a wavelength that is an average (or an intermediate value) of a minimum wavelength and a maximum wavelength of the first wavelength band 310, and the peak wavelength of the second wavelength band 330 may refer to a wavelength of light having the greatest amount of transmission in the second wavelength band 330. In this case, the thickness of the defect layer 125 may have a thickness different from the thicknesses of the first refractive layer and the second refractive layer, which are peripheral layers of the defect layer 125.

As such, the prohibited band (prohibited transmission region) through which light is not transmitted may be formed in a light transmission spectrum (a function of transmittance for a light wavelength) due to the plurality of first refractive layers 121 and 121' and the plurality of second refractive layers 123 and 123' formed alternately with each other; and the pass band through which light may be transmitted may be formed within the prohibited band in the light transmission spectrum due to the defect layer 125 having the thickness different from the thicknesses of the first refractive layer and the second refractive layer. Here, a value of a full width at half maximum (FWHM) of the pass band may have a value of a narrow width in a range of 2 to 50 nm.

Therefore, the LED device 100 of the disclosure may transmit light only in the second wavelength band 330, which is the pass band with the narrow width, within the first wavelength band 310, thereby improving color purity of light.

In addition, the LED device 100 of the disclosure has a structure in which the semiconductor cell 110 and the filter 120 are formed integrally to each other, thereby having simplified manufacturing process and structure and the improved color purity of light. A display apparatus to which such an LED device is applied may improve the color purity of light extracted from the LED device to the outside, thereby widening a range of colors implemented by a combination of red, green and blue colors. In addition, the display apparatus may improve color reproducibility which is a measure of whether a real object color may be reproduced on a screen of the display apparatus.

In addition, the LED device 100 of the disclosure may be placed on a display module to be electrically connected to a driving circuit formed on the display module, and the LED device 100 may emit light based on a signal of the driving circuit. In this case, a plurality of LED devices 100 may be placed on the display module in a matrix form. Here, the display module may be installed and applied to an electronic product or an electronic field that requires a wearable device, a portable device, a handheld device and various displays in a single unit, and may be applied to a display apparatus such as a monitor for a personal computer (PC), a high-definition television (TV), a signage and a billboard through a plurality of assembly arrangements in a matrix type.

Hereinafter, an LED device according to an embodiment is described in detail with reference to FIGS. 2, 3A, 3B, 4A, 4B, 5A, 5B, 6A, 6B and 6C.

Figure 2:
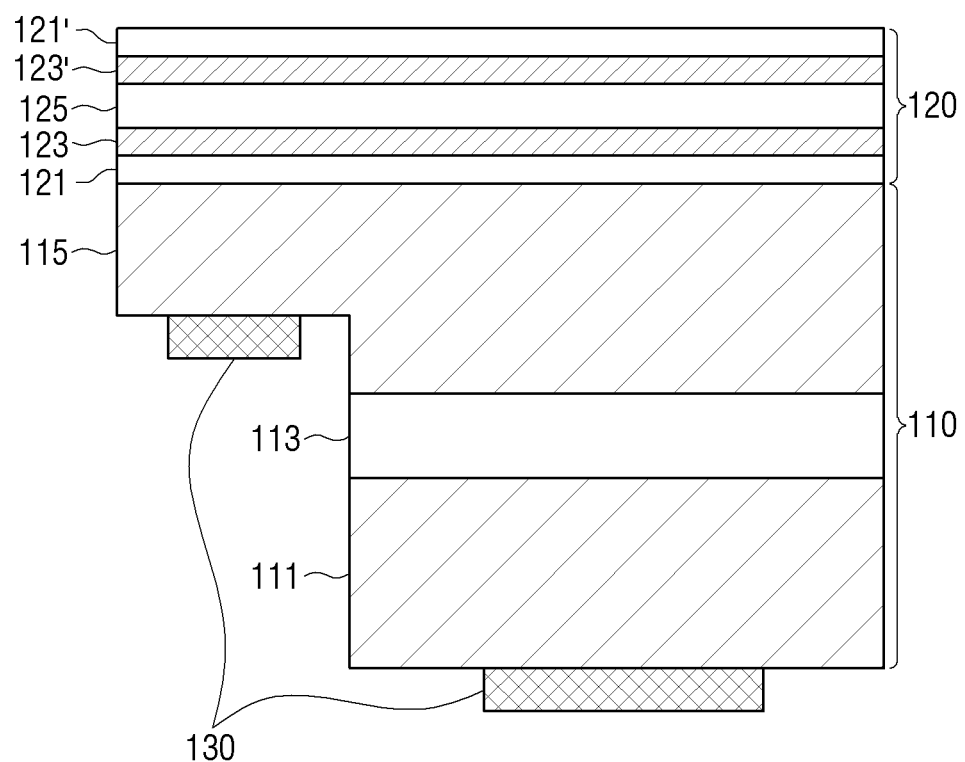
FIG. 2 is a view for describing an LED device according to an embodiment.

FIG. 2 is a cross-sectional view of an LED device for describing an LED device according to an embodiment.

Referring to FIG. 2, the LED device 100 according to an embodiment may further include electrodes 130 in addition to the first semiconductor layer 111, the light emitting layer 113, the second semiconductor layer 115 and the filter 120.

The first semiconductor layer 111 may include the first-type semiconductor, and the second semiconductor layer 115 may include the second-type semiconductor different from the first-type semiconductor. The first semiconductor layer 111 and the second semiconductor layer 115 may be formed of at least one layer. Here, the layer may have a structure with a smaller height compared to its width and length, which may be referred to as a vertically-formed structure.

The light emitting layer 113 may be formed between the first semiconductor layer 111 and the second semiconductor layer 115, and may emit light based on the difference between the voltage applied to the first semiconductor layer 111 and the voltage applied to the second semiconductor layer 115.

In detail, in case that the difference between the voltage applied to the n-type semiconductor layer and the voltage applied to the p-type semiconductor layer is equal to or greater than a threshold voltage, the electron provided in the n-type semiconductor and the hole provided in the p-type semiconductor may be recombined to each other in the light emitting layer 113, and the light emitting layer 113 may thus emit light (photon packet) of a specific wavelength (or specific color) corresponding to band gap energy. Here, the difference between the voltage applied to the n-type semiconductor layer and the voltage applied to the p-type semiconductor layer may be referred to as a bias. A forward bias may indicate a bias in which a voltage of an anode is applied to the p-type semiconductor layer and a voltage of a cathode is applied to the n-type semiconductor layer; and a reverse bias may indicate a bias in which the voltage of the cathode is applied to the p-type semiconductor layer and the voltage of the anode is applied to the n-type semiconductor layer. In this case, the threshold voltage (or operating voltage) may be determined differently based on materials and structures of the first semiconductor layer 111 and the second semiconductor layer 115, a light color of the light emitting layer 113, etc. Here, the threshold voltage may have a specific value such as +1.8V or +3.4V of the forward bias based on, for example, the materials and structures of the first semiconductor layer 111 and the second semiconductor layer 115, the light color of the light emitting layer 113, etc.

Meanwhile, the light emitting layer 113 may not emit light in case that the difference between the voltage applied to the first semiconductor layer 111 and the voltage applied to the second semiconductor layer 115 is less than the threshold voltage.

In addition, the light emitting layer 113 may emit light of a specific color based on the difference between the voltage applied to the first semiconductor layer 111 and the voltage applied to the second semiconductor layer 115. To this end, the first and second semiconductor layers 111 and 115 may be formed of various compound semiconductors having specific band gap energy corresponding to a specific wavelength of the spectrum. For example, the first and second semiconductor layers 111 and 115 including a compound semiconductor may be formed by growing a crystal with certain directionality on a single crystal wafer such as aluminum oxide ($Al_2O_3$), silicon (Si), silicon carbide (SiC), gallium arsenide (GaAs), gallium phosphide (GaP) or the like through epitaxy growth.

In this case, the specific band gap energy may be determined based on the compound and a composition ratio of the first and second semiconductor layers 111 and 115 in the semiconductor cell 110, and the light emitting layer 113 may emit light of a specific wavelength (or specific color) corresponding to the band gap energy. For example, the red semiconductor cell 110 may include one or more semiconductor layers based on an AlInGaP-based semiconductor to emit red light having a wavelength of 600 to 750 nm. In addition, the blue and green semiconductor cells 110 may include one or more semiconductor layers based on the AlInGaN-based semiconductor to emit blue and green light having wavelengths of 450 to 490 nm and 500 to 570 nm, respectively. Here, the red semiconductor cell 110 only refers to the semiconductor cell 110 that emits red light, and does not refer to the color of the semiconductor cell 110 itself. The same is true for the blue and green semiconductor cells 110.

The filter 120 may be formed on the second semiconductor layer 115 to transmit light in the second wavelength band 330 within the first wavelength band 310. To this end, the filter 120 may be formed on a top surface of the second semiconductor layer 115 in consideration of the path in which light emitted from the light emitting layer 113 is extracted to the outside. However, this is only an example, and in case that another layer (e.g., a color conversion layer) is formed between the filter 120 and the second semiconductor layer 115, the filter 120 may be formed on a top surface of the another layer. A more detailed description of the filter 120 is described below with reference to FIGS. 3A and 3B.

The electrodes 130 may apply an external voltage to the first semiconductor layer 111 and the second semiconductor layer 115. To this end, the electrodes 130 may be formed on each one side of the first semiconductor layer 111 and the second semiconductor layer 115, and the electrodes 130 may include a first electrode and a second electrode. For example, the first electrode may be formed on a top surface of the first semiconductor layer 111 to be in electrical contact (ohmic contact) with the first semiconductor layer 111, and the second electrode may be formed on the top surface of the second semiconductor layer 115 to be in electrical contact with the second semiconductor layer 115. Here, in case that the semiconductor layer in contact with the first electrode and the second electrode is the n-type (or p-type), it may be referred to as an n-electrode (or p-electrode).

In addition, the electrodes 130 may be made of a material having high conductivity. For example, the electrodes 130 may be made of a metal such as aluminum (Al), titanium (Ti), chromium (Cr), nickel (Ni), palladium (Pd), silver (Ag), germanium (Ge) or gold (Au), or an alloy thereof, and may be made of a conductive oxide such as indium tin oxide (ITO) or zinc oxide (ZnO).

Meanwhile, FIG. 2 illustrates that the electrodes 130 are formed on a bottom surface of the first semiconductor layer 111 and a bottom surface of the second semiconductor layer 115, respectively. However, such a placement is only an embodiment, and the placement of the electrodes 130 may be variously modified. In this case, a structural shape of the LED device 100 may also be changed based on the placement of the electrodes 130. A detailed description thereof is described below with reference to FIGS. 6A, 6B and 6C.

Hereinafter, a filter according to an embodiment is described in detail with reference to FIGS. 3A and 3B. FIG. 3A is a cross-sectional view of a filter 120 for describing a structure of a filter according to an embodiment. FIG. 3B is a view illustrating a light transmission spectrum of a filter for describing a light characteristic of a filter according to an embodiment.

The filter 120 may be formed on the second semiconductor layer 115 to transmit light in the second wavelength band 330 within the first wavelength band 310.

Referring to FIG. 3A, the filter 120 to this end may include a plurality of first refractive layers 121-1, 121-2, 121-1' and 121-2', a plurality of second refractive layers 123-1, 123-2, 123-1' and 123-2' and the defect layer 125.

The plurality of first refractive layers 121-1, 121-2, 121-1' and 121-2' and the plurality of second refractive layers 123-1, 123-2, 123- and 123-2' may be formed alternately with each other on one side and the other side of the defect layer 125. For example, the first refractive layers 121 and the second refractive layers 123 may be formed alternately (or periodically) and repeatedly on the bottom surface of the defect layer 125, and the first refractive layers 121' and the second refractive layers 123' may be formed alternately and repeatedly on the top surface of the defect layer 125.

According to an embodiment, the first refractive layers 121-1 and 121-2 and the second refractive layers 123-1 and 123-2 may be formed alternately with each other between the second semiconductor layer 115 and the defect layer 125 in order of the first refractive layer 121 and the second refractive layer 123. In addition, the first refractive layers 121-1' and 121-2' and the second refractive layers 123-1' and 123-2' may be formed alternately with each other on the defect layer 125 in order of the second refractive layer 123 and the first refractive layer 121. For example, the first refractive layer 121-1, the second refractive layer 123-1, the first refractive layer 121-2, the second refractive layer 123-2, etc. may be repeatedly formed between the second semiconductor layer 115 and the defect layer 125. In addition, the second refractive layer 123-2', the first refractive layer 121-2', the second refractive layer 123-1', the first refractive layer 121-1', etc. may be repeatedly formed on the defect layer 125.

Meanwhile, according to an embodiment, the number of the first refractive layers 121-1 and 121-2 and the second refractive layers 123-1 and 123-2 formed on one side of the defect layer 125 may be the same as the number of the first refractive layers 121-1' and 121-2' and the second refractive layers 123-1' and 123-2' formed on the other side of the defect layer 125. For example, if the first refractive layer 121 and the second refractive layer 123 which are formed on one side of the defect layer 125 has an n number, the first refractive layer and the second refractive layer 123' which are formed on the other side of the defect layer 125 may have the same n number. Accordingly, a total number of the plurality of first refractive layers 121 and 121' and the plurality of second refractive layers 123 and 123' which are included in the filter 120 may be an even number of 2n (here, n is any natural number). Furthermore, assuming that the number of the defect layer 125 is 1, the total number of layers included in the filter 120 may be 2n+1 (e.g., 5, 7, 9, 11, etc.).

Meanwhile, according to an embodiment, the plurality of first refractive layers 121-1, 121-2, 121-1' and 121-2' and the plurality of second refractive layers 123-1, 123-2, 123-1' and 123-2' may be formed alternately to be symmetrical to each other with respect to the defect layer 125. That is, the order in which the first and second refractive layers 121 and 123 are formed on one side of the defect layer 125 and the order in which the second and first refractive layers 123 and 121 are formed on the other side of the defect layer 125, with respect to the defect layer 125, may be different from each other; and the number of the first and second refractive layers 121 and 123 which are formed on one side of the defect layer 125 and the number of the first and second refractive layers 123 and 121 which are formed on the other side of the defect layer 125 may be the same as each other.

Meanwhile, referring to FIGS. 3A and 3B, a thickness $d_L$ of the first refractive layer 121 may be determined based on a center wavelength $\lambda_0$ of the first wavelength band 310 and a refractive index $n_L$ of the first refractive layer 121. In addition, a thickness $d_H$ of the second refractive layer 123 may be determined based on the center wavelength $\lambda_0$ of the first wavelength band 310 and a refractive index $n_H$ of the second refractive layer 123.

For example, the thickness $d_L$ of the first refractive layer 121 may be determined based on Equation 1 below, and the thickness $d_H$ of the second refractive layer 123 may be determined based on Equation 2 below.

$$d_L = \left(\frac{1}{n_L}\right)\left(\frac{\lambda_0}{4}\right) \quad \text{[Equation 1]}$$

$$d_H = \left(\frac{1}{n_H}\right)\left(\frac{\lambda_0}{4}\right) \quad \text{[Equation 2]}$$

Here, the first wavelength band 310 may include a wavelength band corresponding to one of red, green and blue colors of light incident on the filter 120. Here, the wavelength band may refer to a band between the minimum wavelength and the maximum wavelength. For example, in the case of the blue color, the first wavelength band 310 may refer to a band between the minimum wavelength of 420 nm and the maximum wavelength of 500 nm. However, this band is only an embodiment, and the first wavelength band 310 is for forming the prohibited band through which light is not transmitted within the band, and may be variously modified based on a wavelength band of light emitted from the light emitting layer 113.

In this case, the center wavelength $\lambda_0$ of the first wavelength band 310 may refer to a wavelength that is the average of the minimum wavelength and the maximum wavelength of the first wavelength band 310.

Meanwhile, the refractive index $n_L$ of the first refractive layer 121 may have a value smaller than the refractive index $n_H$ of the second refractive layer 123. That is, the refractive index $n_H$ of the second refractive layer 123 may have a value greater than the refractive index $n_L$ of the first refractive layer 121.

In an embodiment, the first refractive layer 121 may have the refractive index $n_L$ of 1.0 or more and 2.0 or less, and the second refractive layer 123 may have the refractive index $n_H$ of 2.0 or more and 3.0 or less. To this end, the first refractive layer 121 may include a material such as silicon dioxide ($SiO_2$), silicon nitride ($SiN_x$), magnesium fluoride ($MgF_2$) or an alloy made of a combination thereof, and the second refractive layer 123 may include of a material such as titanium dioxide ($TiO_2$), niobium pentoxide ($Nb_2O_5$), tantalum pentoxide ($Ta_2O_5$) or an alloy made of a combination thereof. Furthermore, a thermally and chemically stable resin may be used for the first refractive layer 121 and the second refractive layer 123.

Referring to FIGS. 3A and 3B, the defect layer 125 may be formed as an intermediate layer of the filter 120. In detail, the defect layer 125 may be formed as the intermediate layer in a structure in which the plurality of first refractive layers 121-1, 121-2, 121-1' and 121-2' and the plurality of second refractive layers 123-1, 123-2, 123-1' and 123-2' are formed alternately with each other. For example, the defect layer 125 may be formed between the plurality of second refractive layers 123-2 and 123-2', and here, a refractive index $n_{defect}$ of the defect layer 125 may be smaller than the refractive index $n_H$ of the second refractive layer 123.

A thickness $d_{defect}$ of the defect layer 125 may be determined based on a peak wavelength $\lambda p$ (reference numeral 320) of the second wavelength band 330 and the refractive index $n_{defect}$ of the defect layer 125.

Here, the refractive index $n_{defect}$ of the defect layer 125 may be the same as the refractive index $n_L$ of the first refractive layer 121. However, this refractive index $n_{defect}$ of the defect layer 125 is only an embodiment and may be variously modified. The description hereinafter is described under an assumption that the refractive index $n_{defect}$ of the defect layer 125 is the same as the refractive index $n_L$ of the first refractive layer.

According to an embodiment, the thickness $d_{defect}$ of the defect layer 125 may have a value within a range of Equation 3 or Equation 4 as shown below based on the refractive index $n_L$ and the center wavelength $\lambda_0$ of the first wavelength band 310.

$$0 < d_{defect} < \left(\frac{1}{n_L}\right)\left(\frac{\lambda_0}{4}\right) \quad \text{[Equation 3]}$$

$$\left(\frac{1}{n_L}\right)\left(\frac{\lambda_0}{4}\right) < d_{defect} < \left(\frac{1}{n_L}\right)\left(\frac{3\lambda_0}{4}\right) \quad \text{[Equation 4]}$$

As an embodiment, the thickness $d_{defect}$ of the defect layer 125 may be determined based on (1) or (2) of Equation 5 below under an assumption that the thickness $d_{defect}$ of the defect layer 125 has the above-described range of Equation 3. Here, (1) of Equation 5 summarizes the peak wavelength $\lambda p$ of the second wavelength band 330, and (2) of Equation 5 summarizes the defect $d_{defect}$ of the defect layer 125 in (1) of Equation 5. In this case, the thickness $d_{defect}$ of the defect layer 125 has a positive value regardless of a sign.

[Equation 5]

$$\text{if } d_{defect} < \frac{\lambda_0}{4n_L},$$

$$\lambda_p = n_L d_{defect} + \lambda_0 \quad (1)$$

$$d_{defect} = \frac{\lambda_p - \lambda_0}{n_L} \quad (2)$$

Here, the thickness $d_{defect}$ of the defect layer 125 may be determined based on the center wavelength $\lambda_0$ of the first wavelength band 310, the peak wavelength λp of the second wavelength band 330 and the refractive index $n_{defect}$ of the defect layer 125. Here, the peak wavelength λp of the second wavelength band 330 may refer to a wavelength having the greatest amount of light transmitted in the second wavelength band 330 which is the pass band through which light is transmitted. Here, in order to form the second wavelength band 330, the peak wavelength λp of the second wavelength band 330 and the center wavelength $\lambda_0$ of the first wavelength band 310 may have values different from each other.

In addition, in an embodiment, the thickness $d_{defect}$ of the defect layer 125 may be determined based on (1) or (2) of Equation 6 below under an assumption that the thickness $d_{defect}$ of the defect layer 125 has the above-described range of Equation 4. Here, (1) of Equation 6 summarizes the peak wavelength λp of the second wavelength band 330, and (2) of Equation 6 summarizes the defect $d_{defect}$ of the defect layer 125 in (1) of Equation 6. In this case, the thickness $d_{defect}$ of the defect layer 125 has a positive value regardless of a sign.

[Equation 6]

$$\text{if } \frac{\lambda_0}{4n_L} < d_{defect} < \frac{3\lambda_0}{4n_L},$$

$$\lambda_p = n_L d_{defect} + \frac{\lambda_0}{2} \quad (1)$$

$$d_{defect} = \frac{2\lambda_p - \lambda_0}{2n_L} \quad (2)$$

The description hereinafter describes an embodiment in which the thicknesses of the first refractive layer 121, the second refractive layer 123 and the defect layer 125 are determined based on the above-described equation. Here, it is assumed that the first refractive layer 121 and the defect layer 125 are made of $SiO_2$ having the refractive index $n_L$ of about 1.4, and the second refractive layer 123 is made of $TiO_2$ having the refractive index $n_H$ of about 2.3.

As an embodiment, in case that the light emitted from the light emitting layer 113 is the blue color, if the center wavelength $\lambda_0$ of the first wavelength band 310 is set to 450 nm, the first refractive layer 121 may have the following thickness $d_L$ calculated based on Equation 1: (1/1.4)×(450 nm/4)=80.4 nm, and the second refractive layer 123 may have the following thickness calculated based on Equation 2: (1/2.3)×(450 nm/4)=48.9 nm. Here, if the peak wavelength λp of the second wavelength band 330 is set to 460 nm, the defect layer 125 may have the following thickness $d_{defect}$ calculated based on (2) of Equation 5: (460 nm−450 nm)/(1.4)=7.1 nm.

In an embodiment, in case that the light emitted from the light emitting layer 113 is the green color, if the center wavelength $\lambda_0$ of the first wavelength band 310 is set to 520 nm and the peak wavelength λp of the second wavelength band 330 is set to 540 nm, the first refractive layer 121 may have the thickness $d_L$ of 92.9 nm based on Equation 1, and the second refractive layer 123 may have the thickness $d_H$ of 56.5 nm based on Equation 2. The defect layer 125 may have the following thickness $d_{defect}$ calculated based on (2) of Equation 5: (540 nm−520 nm)/(1.4)=14.3 nm.

In an embodiment, in case that the light emitted from the light emitting layer 113 is the red color, if the center wavelength $\lambda_0$ of the first wavelength band 310 is set to 600 nm and the peak wavelength λp of the second wavelength band 330 is set to 650 nm, the first refractive layer 121 may have the thickness $d_L$ of 107.1 nm based on Equation 1, and the second refractive layer 123 may have the thickness $d_H$ of 65.2 nm based on Equation 2. The defect layer 125 may have the following thickness $d_{defect}$ calculated based on (2) of Equation 5: (650 nm−600 nm)/(1.4)=35.7 nm.

Meanwhile, FIG. 3B illustrates that the center wavelength $\lambda_0$ of the first wavelength band 310 is greater than the peak wavelength λp of the second wavelength band 330. However, this relationship is only an embodiment, and unlike FIG. 3B, the scale relationship between the center wavelength $\lambda_0$ of the first wavelength band 310 and the peak wavelength λp of the second wavelength band 330 may be modified.

Figure 4A:
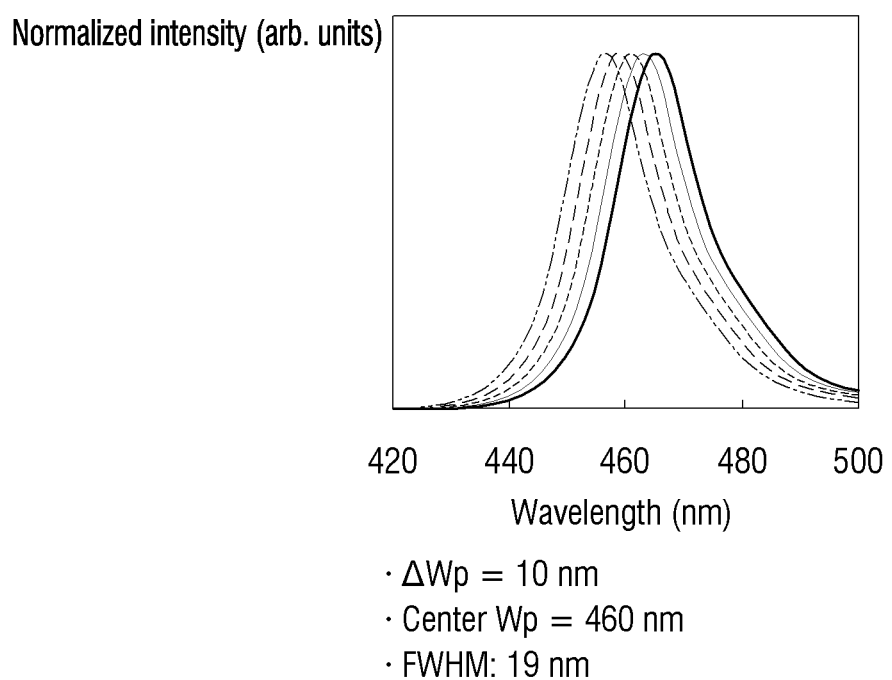
FIG. 4A is a view for describing a light characteristic of an LED device according to an embodiment.
Figure 4B:
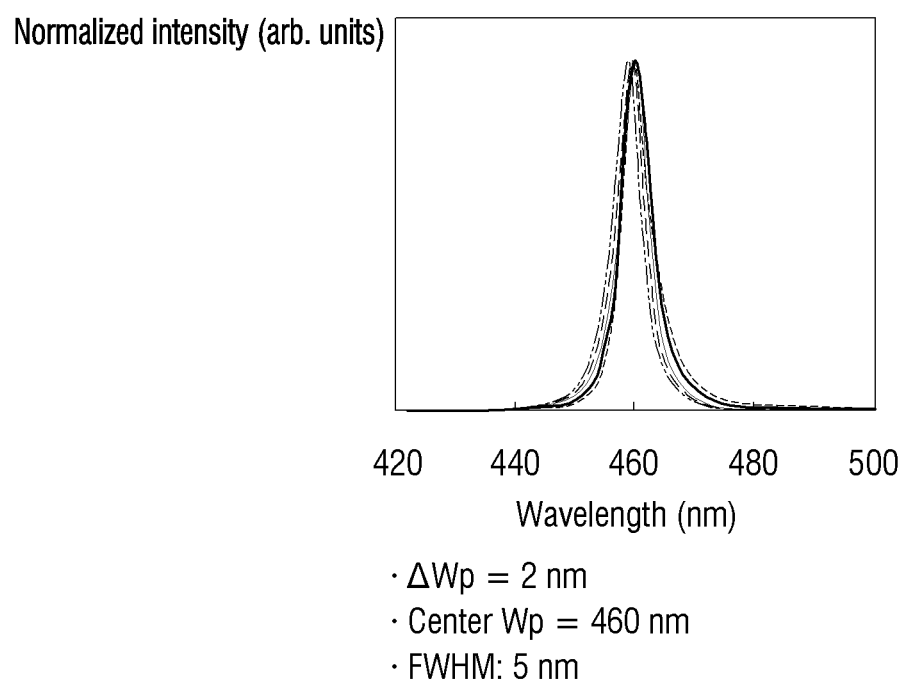
FIG. 4B is a view for describing a light characteristic of an LED device according to an embodiment.
Figure 4C:
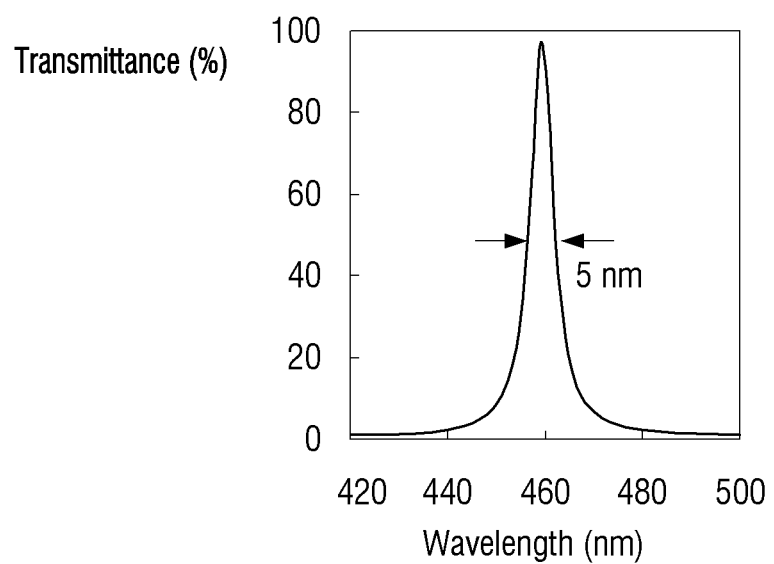
FIG. 4C is a view for describing a light characteristic of an LED device according to an embodiment.

FIGS. 4A, 4B and 4C are views for describing light characteristics of an LED device according to an embodiment. Hereinafter, it is assumed that light emitted from the light emitting layer 113 of the LED device 100 has a wavelength band (e.g., 420 to 500 nm) corresponding to the blue color.

FIG. 4A illustrates a light spectrum distribution of a case in which light emitted from the light emitting layer 113 is extracted to the outside in case that the filter 120 is not formed in the LED device 100 according to an embodiment. Here, the light spectrum for each of the plurality of LED devices 100 in which the filter 120 is not formed is illustrated by graphs divided into a solid line, a dotted line and a double-dashed line.

Referring to FIG. 4A, the light spectrum for each of the plurality of LED devices 100 may have a wavelength within 455 to 465 nm as a peak wavelength (wavelength with maximum light intensity). In this case, the center peak wavelength $w_p$ may be 460 nm, which is an average of the peak wavelength, and a difference $\Delta w_p$ in the peak wavelength may be 10 nm, which is the difference between the maximum value 465 nm and minimum value 455 nm of the peak wavelength. In addition, a value of the FWHM may be 19 nm. Here, the value of the FWHM may refer to a difference (interval) between two wavelengths with light intensity of 50% under an assumption that light intensity is 100% at the peak wavelength.

FIG. 4C is a view describing a light transmission spectrum of the filter 120 according to an embodiment.

As described above, the light transmission spectrum of the filter 120 formed on the LED device 100 according to an embodiment may determine the center wavelength of the first wavelength band 310 by adjusting each thickness and refractive index of the first and second refractive layers 121 and 123 based on Equations 1 and 2, and determine the peak wavelength λp of the second wavelength band 330 by adjusting the thickness and refractive index of the defect layer 125 based on Equation 5 or Equation 6. For example, as illustrated in FIG. 4C, the peak wavelength λp of the second wavelength band 330 may be determined to be 460 nm, and a value of the FWHM in this case may be 5 nm.

FIG. 4B illustrates a light spectrum distribution of a case in which light emitted from the light emitting layer 113 is extracted to the outside if the filter 120 is formed in the LED device 100 according to an embodiment. In this case, the light spectrum may refer to a graph illustrating the relationship of light intensity to a wavelength of light for each of the LED devices 100. Here, the light spectrum for each of the plurality of LED devices 100 in which the filter 120 is not formed is illustrated by graphs divided into a solid line, a dotted line and a double-dashed line.

Referring to FIG. 4B, the light spectrum for each of the plurality of LED devices 100 may have a wavelength within 459 to 461 nm as the peak wavelength. In this case, the center peak wavelength $w_p$ may be 460 nm, which is the average of the peak wavelength, and the difference $\Delta w_p$ in the peak wavelength may be 2 nm, which is the difference between the maximum value 461 nm and minimum value 459 nm of the peak wavelength. In addition, a value of the FWHM may be 5 nm.

Meanwhile, the light spectrum illustrated in FIG. 4A indicates the light spectrum in case that light emitted from the plurality of LED devices 100 in which the filter 120 is not formed is extracted to the outside. The light spectrum illustrated in FIG. 4B illustrated the light spectrum in case that light emitted from the plurality of LED devices 100 in which the filter 120 is formed is incident on the filter 120. In this case, as illustrated in FIG. 4B, the light spectrum distribution of a case in which light emitted from the plurality of LED devices 100 in which the filter 120 is formed is extracted to the outside through the filter 120 may be obtained as a result of multiplying the light spectrum illustrated in FIG. 4A by the light transmission spectrum of the filter 120 illustrated in FIG. 4C.

As such, the prohibited transmission region through which light is not transmitted may be formed in a light transmission spectrum due to the plurality of first refractive layers 121 and 121' and the plurality of second refractive layers 123 and 123' formed alternately with each other; and the pass band through which light may be transmitted may be formed in the prohibited band within the light transmission spectrum due to the defect layer 125 having the thickness different from the thicknesses of the first refractive layer and the second refractive layer. Here, the value of the FWHM of the pass band may have a value of the narrow width in the range of 2 to 50 nm.

Therefore, the LED device 100 of the disclosure may transmit light only in the second wavelength band 330, which is the pass band with the narrow width, within the first wavelength band 310, thereby improving the color purity of the light.

Figure 5A:
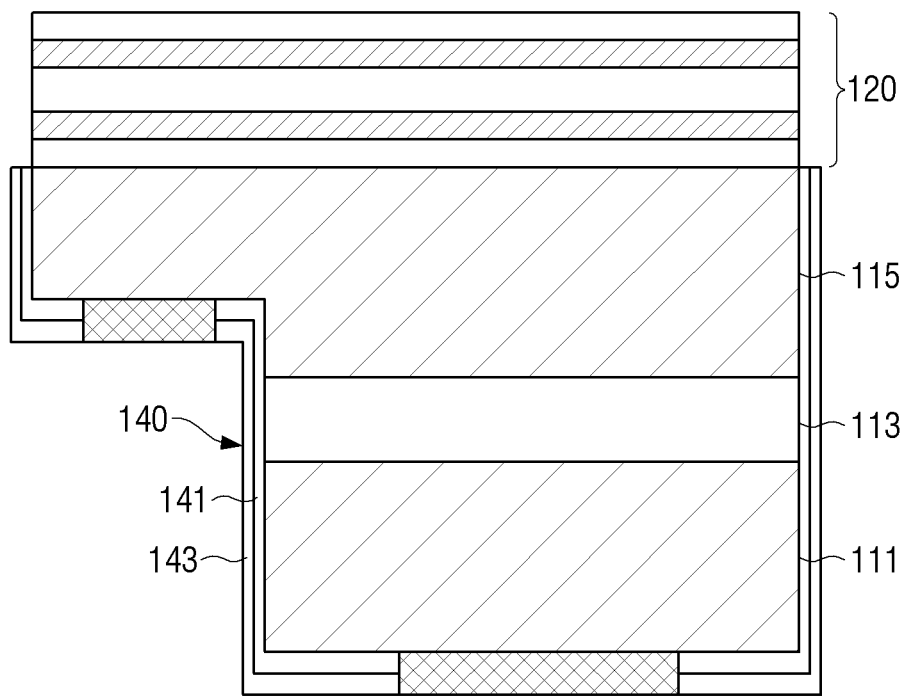
FIG. 5A is a view for describing a structure of an LED device according to an embodiment.

FIG. 5A is a view for describing a structure of an LED device according to an embodiment.

Referring to FIG. 5A, the LED device 100 according to an embodiment may further include a reflective layer 140 in addition to the first semiconductor layer 111, the light emitting layer 113, the second semiconductor layer 115 and the filter 120. Here, the reflective layer 140 may be configured to reflect light emitted from the light emitting layer 113 to the filter 120.

To this end, the reflective layer 140 may be formed on outer surfaces of the first semiconductor layer 111, the second semiconductor layer 115 and the light emitting layer 113. For example, the reflective layer 140 may be formed on the outer surfaces of the first semiconductor layer 111, the second semiconductor layer 115 and the light emitting layer 113, and may further be formed on a sidewall except for a top surface of the filter 120.

Meanwhile, FIG. 5A illustrates that an angle of the reflective layer 140 is 90 degrees based on a horizontal plane. However, this angle is only an embodiment, and the angle may be variously changed (e.g., to an angle within 5 to 85 degrees) with respect to the horizontal plane. In this case, as the angle of the reflective layer 140 is changed, angles with respect to the side surfaces of the first semiconductor layer 111, the second semiconductor layer 115 and the light emitting layer 113 may also be changed.

Meanwhile, the reflective layer 140 may include a passivation layer 141 and a mirror layer 143.

The passivation layer 141 may be formed on the surfaces of the first semiconductor layer 111, second semiconductor layer 115 and light emitting layer 113, and may be made of an insulating material (e.g., $Al_2O_3$, SiN, $SiO_2$ or the like) to protect and electrically insulate the first semiconductor layer 111, the second semiconductor layer 115 and the light emitting layer 113. In addition, the passivation layer 141 may be made of a transparent insulating material.

Meanwhile, the passivation layer 141 may have an opening region for a portion where the filter 120 is formed, and the filter 120 may thus be formed on the top surface of the second semiconductor layer 115. In addition, the passivation layer 141 may also have opening regions for portions where the electrodes 130 are formed, respectively, and the electrodes 130 may thus be formed on the top or bottom surfaces of the first semiconductor layer 111 and the second semiconductor layer 115.

The mirror layer 143 may be formed on a surface of the passivation layer 141. In addition, the mirror layer 143 may be made by using various materials having high reflectivity. Unlike FIG. 5A, in case of being made of a material having high conductivity, such as a metal material (e.g., aluminum (Al)), the mirror layer 143 may divide the first electrode and the second electrode, which configure the electrodes 130, not to be electrically connected to each other.

Meanwhile, the mirror layer 143 may be formed to have a structure of a metal reflector or that of a distributed-Bragg-reflector (DBR). In detail, the structure of the distributed-Bragg-reflector may be implemented as a structure of a plurality of layers in which two layers having different refractive indices are stacked alternately with each other. In addition, Fresnel reflection may thus occur at an interface of each layer due to a difference in refractive indices of the two different layers, and all reflected waves may cause constructive interference based on a material included in the structure of the plurality of layers and its thickness. Accordingly, the mirror layer 143 formed to have the structure of the dispersed-Bragg-reflector may have high reflectivity.

Figure 5B:
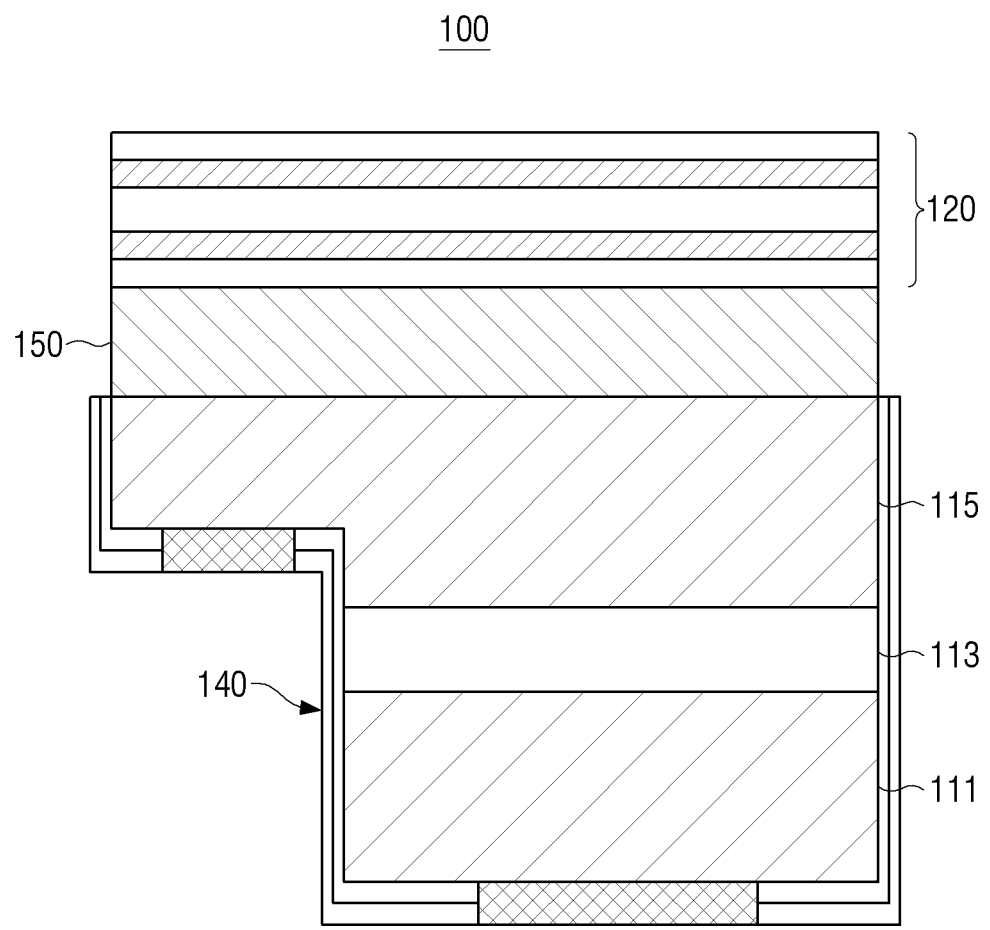
FIG. 5B is a view for describing a structure of an LED device according to an embodiment.

FIG. 5B is a view for describing a structure of an LED device according to an embodiment.

Referring to FIG. 5B, the LED device 100 according to an embodiment may further include a color conversion layer 150 in addition to the first semiconductor layer 111, the light emitting layer 113, the second semiconductor layer 115 and the filter 120. Here, the color conversion layer 150 may be configured to convert a color of light emitted from the light emitting layer 113.

To this end, the color conversion layer 150 may be formed between the second semiconductor layer 115 and the filter 120. For example, the color conversion layer 150 may be formed on the top surface of (or inside) the second semiconductor layer 115 and on a bottom surface of the filter 120. Here, the color conversion layer 150 may include at least one of a phosphor or a quantum dot (QD).

Here, the phosphor may refer to an organic or inorganic material that absorbs light emitted from the light emitting layer 113 and emits light of a specific wavelength based on a difference in energy level. In addition, the quantum dot may refer to an ultrafine semiconductor particle with a diameter of only 2 to 10 nm that emits light of a specific wavelength if exposed to light emitted from the light emitting layer 113. In particular, the quantum dot may emit light of various colors based on a size of the particle. For example, a quantum dot having a size of 2 nm may emit blue light, and a quantum dot having a size of 6 nm may emit red light.

Figure 6A:
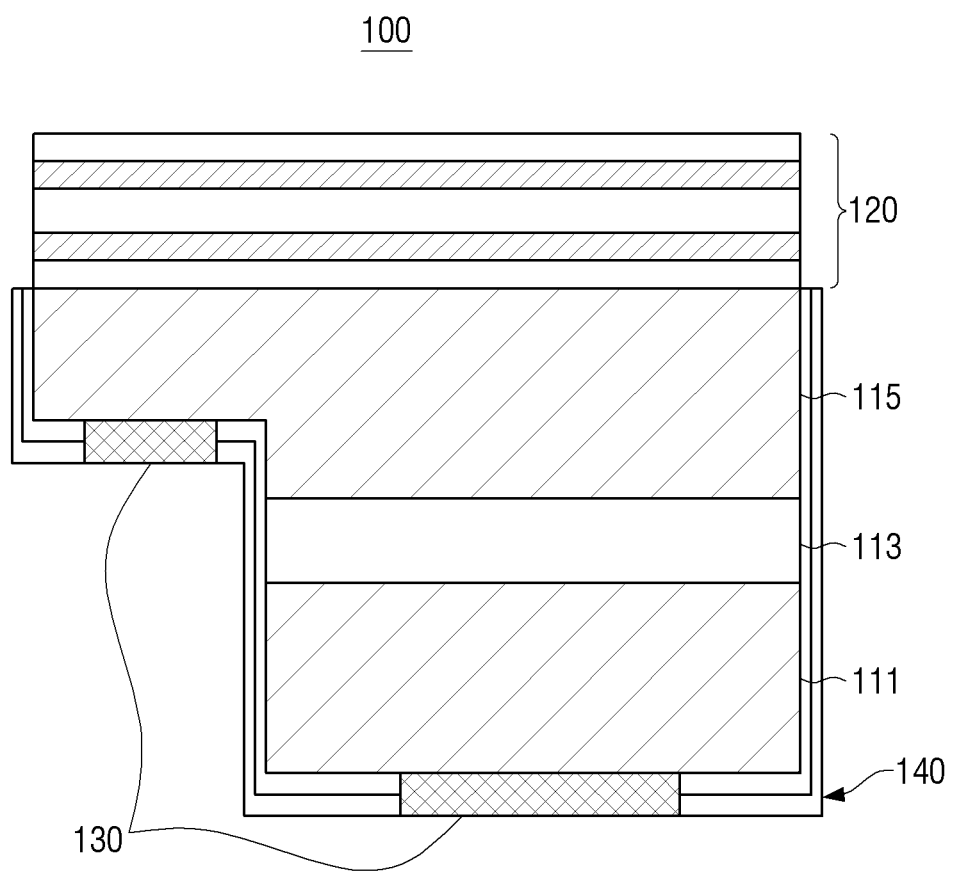
FIG. 6A is a view for describing a structure of an LED device according to an embodiment.
Figure 6B:
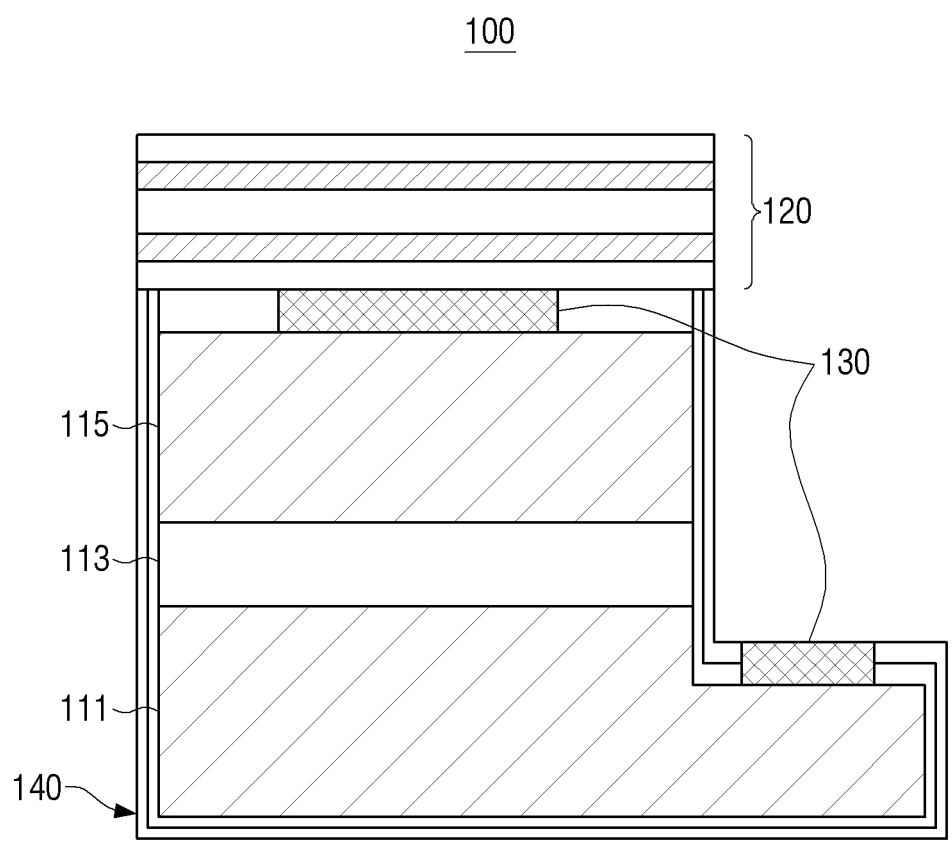
FIG. 6B is a view for describing a structure of an LED device according to an embodiment.
Figure 6C:
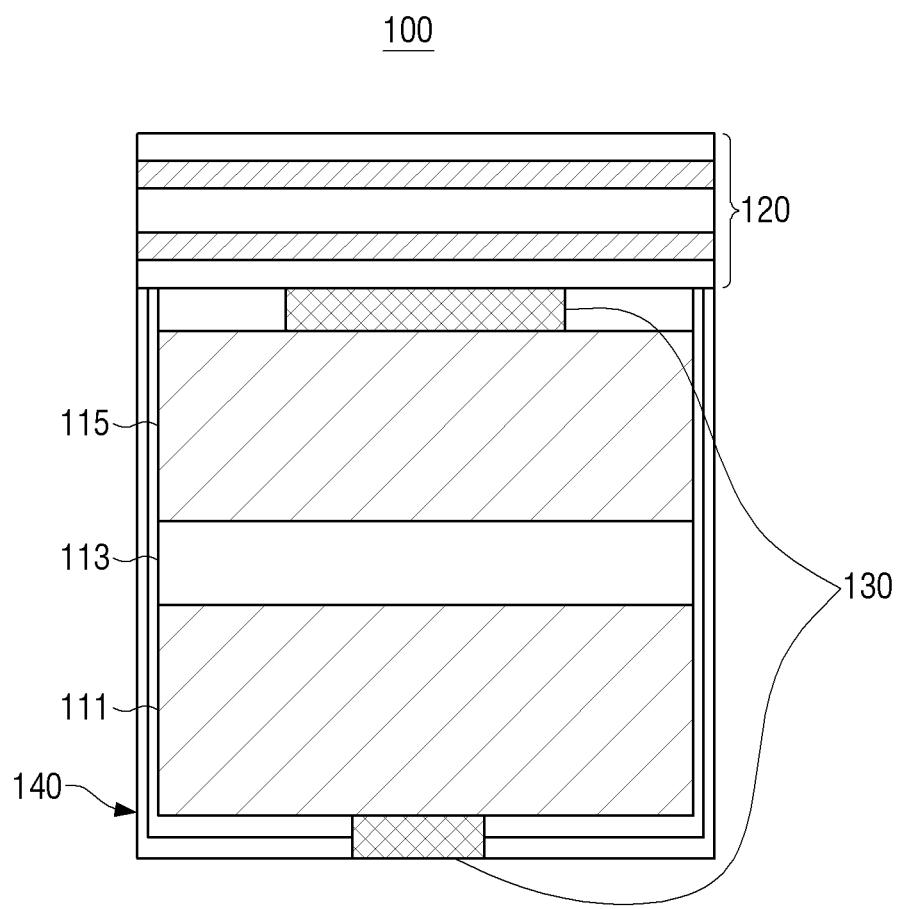
FIG. 6C is a view for describing a structure of an LED device according to an embodiment.

FIGS. 6A, 6B and 6C are views for describing structures of an LED device according to an embodiment.

Referring to FIGS. 6A, 6B and 6C, the LED device 100 according to an embodiment may be formed to have various structures according to the placement of the electrodes 130.

The structure of the LED device 100 according to an embodiment may be divided into a lateral type in which the electrodes 130 are placed laterally with respect to the semiconductor cell 110 as illustrated in FIGS. 6A and 6B, and a vertical type in which the electrodes 130 are placed vertically with respect to the semiconductor cell 110 as illustrated in FIG. 6C. The lateral type may be divided into a structure in which the electrodes 130 are placed on bottom surfaces of the semiconductor cell 110 as illustrated in FIG. 6A and a structure in which the electrodes 130 are placed on top surfaces of the semiconductor cell 110 as illustrated in FIG. 6A. Here, the structure in which the electrodes 130 are placed on the bottom surfaces of the semiconductor cell 110 may be referred to as a flip chip type. In this consideration, the structure in which the electrodes 130 of the lateral-type LED device 100 are placed on the top surfaces of the semiconductor cell 110 may hereinafter be referred to as a lateral-type LED device 100; and the structure in which the electrodes 130 are placed on the bottom surfaces of the semiconductor cell 110 may be referred to as a flip-chip type LED device 100.

As illustrated in FIG. 6A, the LED device 100 according to an embodiment may be formed to have the flip-chip type structure. In the flip-chip type LED device 100, the electrodes 130 may be placed (or formed) on the bottom surfaces of the semiconductor cell 110. For example, in the flip-chip type LED device 100, the first electrode and the second electrode configuring the electrodes 130 may be formed on the bottom surface of the first semiconductor layer 111 and on the bottom surface of the second semiconductor layer 115, respectively.

Figure 7A:
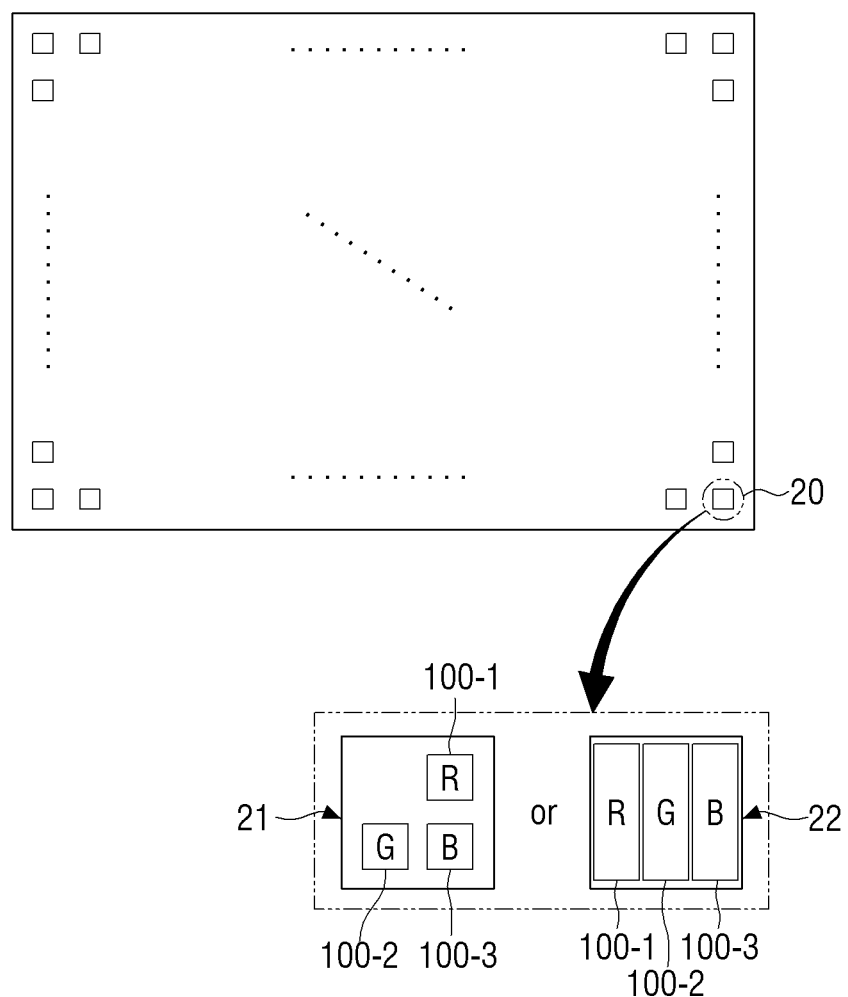
FIG. 7A is a view for describing a display apparatus to which an LED device according to an embodiment is applied.
Figure 7B:
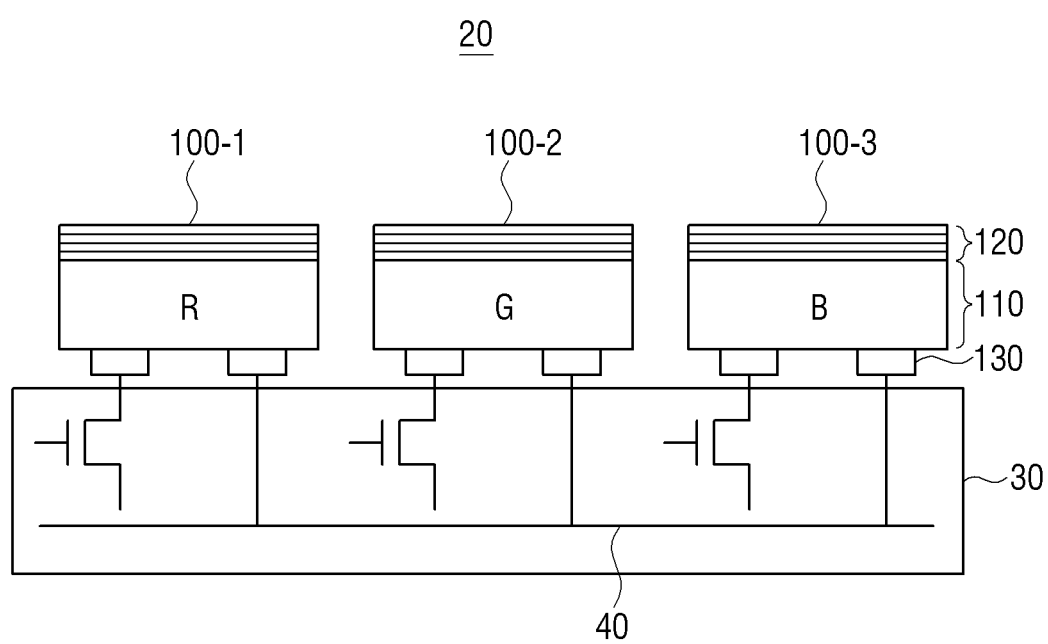
FIG. 7B is a view for describing a display apparatus to which an LED device according to an embodiment is applied.

Then, the flip-chip type LED device 100 may be bonded and electrically connected to a driving circuit 30 of a display apparatus 10 as illustrated in FIGS. 7A and 7B. For example, a bump may be applied between the electrodes 130 of the flip-chip type LED device 100 and electrodes 40 of the driving circuit 30, and the flip-chip type LED device 100 may be bonded to the driving circuit 30 by allowing the applied bump to undergo a curing or firing process by heat at a high or low temperature. To this end, the bump may be made of a conductive resin. For example, the bump may be one of metals such as aluminum (Al), copper (Cu), stannum (Sn), gold (Au), zinc (Zn), lead (Pb) and the like or a mixture or alloy of at least two metals, and implemented as a material in which a powder having an average particle diameter of 0.1 to 10 micrometers and an adhesive paste or a binder resin are mixed with each other.

As illustrated in FIG. 6B, the LED device 100 according to an embodiment may be formed to have the lateral-type structure. In the lateral-type LED device 100, the electrodes 130 may be placed (or formed) on the top surfaces of the semiconductor cell 110. For example, in the lateral-type LED device 100, the first electrode and the second electrode configuring the electrodes 130 may be formed on the top surface of the first semiconductor layer 111 and on the top surface of the second semiconductor layer 115, respectively. Then, the lateral-type LED device 100 may be electrically connected to the driving circuit 30 of the display apparatus 10 through a wire as illustrated in FIGS. 7A and 7B.

As illustrated in FIG. 6C, the LED device 100 according to an embodiment may be formed to have the vertical-type structure. In the vertical-type LED device 100, the electrodes 130 may be placed (or formed) on the top and bottom surfaces of the semiconductor cell 110, respectively. For example, in the vertical-type LED device 100, the first electrode and the second electrode configuring the electrodes 130 may be formed on the bottom surface of the first semiconductor layer 111 and on the top surface of the second semiconductor layer 115, respectively. Then, the vertical-type LED device 100 may be electrically connected to the driving circuit 30 of the display apparatus 10 through the wire, the bump or a combination thereof as illustrated in FIGS. 7A and 7B.

FIGS. 7A and 7B are views for describing a display apparatus to which an LED device according to an embodiment is applied. FIG. 7A is a plan view of the display apparatus 10 and a pixel 20, and FIG. 7B is a cross-sectional view of the pixel 20.

Referring to FIG. 7A, the display apparatus 10 may include at least one pixel 20. Here, the display apparatus 10 is an apparatus capable of processing an image signal received from an external apparatus or an internal storage apparatus (not illustrated) and visually display the processed image, and may be implemented in various forms such as a television (TV), a monitor, a portable multimedia apparatus, a portable communication apparatus, a smartphone, a smart window, a head mount display (HMD), a wearable apparatus, a signage, etc.

The pixel 20 may refer to a unit configuring the image displayed by the display apparatus 10. The pixels 20 may be arranged in a horizontal and vertical matrix form.

As illustrated in FIG. 7A, the pixel 20 may be configured of a plurality of sub-pixels. For example, the pixel 20 may represent light of a specific color and brightness by a combination of sub-pixels of red (R), green (G) and blue (B) colors, which are three components of light. Here, the plurality of sub-pixels (R, G and B) configuring the pixel 20 may be arranged in different sizes and positions based on various types such as a first type 21 and a second type 22. However, this arrangement is only an embodiment, and the sizes, positions, arrangements and the like of the plurality of sub-pixels (R, G and B) may be variously changed based on various types of layouts such as diamond type, delta type, stripe type, RGBW (red, green, blue and white) type, RGBY (red, green, blue and yellow) type, pen-tile type, quad type, mosaic type, etc. Accordingly, the number, arrangement, structure and color of the LED device configuring the sub-pixel may also be variously changed.

As illustrated in 7A and 7B, the pixel 20 may be implemented by a driving of a plurality of LED devices 100-1, 100-2 and 100-3. That is, the sub-pixel may be implemented by the driving of the LED device 100. For example, a red sub-pixel R may be implemented by the driving of the red LED device 100-1, a green sub-pixel G may be implemented by the driving of the green LED device 100-2 and a blue sub-pixel B may be implemented by the driving of the blue LED device 100-3. Here, the plurality of LED devices 100-1, 100-2 and 100-3 have only the difference in a color of the light emitted from each device, and the description of the LED device 100 according to an embodiment may be equally applied thereto.

To this end, the display apparatus 10 according to an embodiment may include the driving circuit 30 for driving the plurality of LED devices 100-1, 100-2 and 100-3.

The driving circuit 30 may be formed inside or on a substrate (not illustrated) of the display apparatus 10. The driving circuit 30 may apply a forward voltage (e.g., a voltage of an anode applied to the p-type semiconductor and a voltage of a cathode applied to the n-type semiconductor) or a reverse voltage (e.g., a voltage of the cathode applied to the p-type semiconductor and a voltage of the anode to the n-type semiconductor) to each of the plurality of LED devices 100-1, 100-2 and 100-3. Accordingly, the driving circuit 30 may individually control the driving (light emission) of the plurality of LED devices 100-1, 100-2 and 100-3.

To this end, the plurality of LED devices 100-1, 100-2 and 100-3 may be mounted on the driving circuit 30, and the electrodes 130 of the plurality of LED devices 100-1, 100-2 and 100-3 and the electrodes 40 of the driving circuit 30 may be electrically connected to each other.

For example, the driving circuit 30 may include individual electrodes (not illustrated) and a common electrode (not illustrated) that are electrically separated (or insulated) from each other, and the individual electrodes and common electrode of the driving circuit 30 may be electrically connected to the first and second electrodes of the plurality of LED devices 100-1, 100-2 and 100-3, respectively.

Here, the individual electrodes may be implemented as switching devices separately connected to each of the LED devices 100-1, 100-2 and 100-3 to apply independent voltages thereto, respectively. For example, in case that the switching device is a thin film transistor (TFT), the TFT may control a specific voltage to be applied to (i.e. in an on state) or not to be applied (i.e. in an off state) to the first electrode of the LED device 100 based on a gate voltage. The TFT (or backplane) is not limited to a specific structure or type. That is, the TFT may be implemented as a low-temperature polycrystalline silicon (LTPS) TFT, an oxide TFT, a poly silicon TFT, an a-silicon (amorphous silicon) TFT, an organic TFT, a graphene TFT or the like, and may be implemented in various types such as a P-type (or N-type) power metal oxide semiconductor field effect transistor (MOSFET) formed in a silicon (Si)-wafer complementary metal oxide semiconductor (CMOS) process.

The common electrode of the plurality of LED devices 100-1, 100-2 and 100-3 may be configured of one electrode commonly connected to the second electrodes of LED devices 100-1, 100-2 and 100-3 to apply a common voltage to the second electrodes of the plurality of LED devices 100-1, 100-2 and 100-3.

Meanwhile, the display apparatus 10 may be driven in a passive matrix or active matrix method, and the driving circuit 30 may be designed based on the driving method of the display apparatus 10.

Meanwhile, the driving circuit 30 may change the intensity (or brightness) of light emitted from the light emitting layer 113 based on a duty ratio of a pulse, and express a gradation by adjusting the duty ratio of the pulse under an assumption that the forward voltage (the voltage of the anode applied to the p-type semiconductor and the voltage of the cathode applied to the n-type semiconductor) based on a pulse width modulation (PWM) method is applied to the first and second semiconductor layers 111 and 115 of the LED device 100. In this case, the duty ratio may indicate a ratio of time in which the pulse has an on state for one period in case that the pulse has the on (high) state or an off (low) state for the one period.

Figure 8:
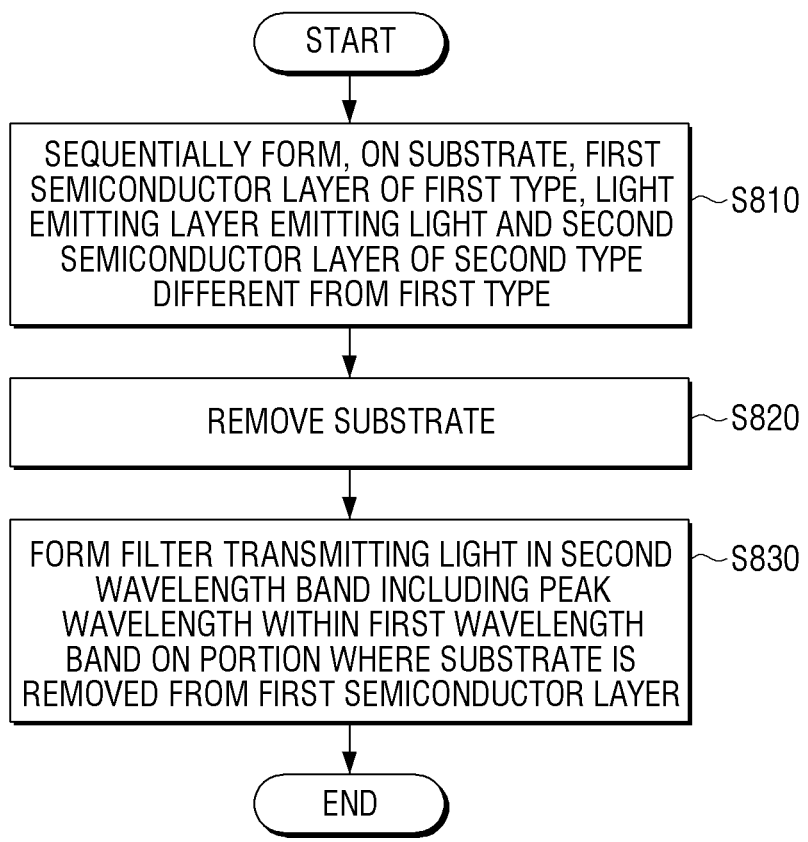
FIG. 8 is a flowchart for describing a manufacturing method of an LED device according to an embodiment.

FIG. 8 is a flowchart for describing a manufacturing method of an LED device according to an embodiment. Hereinafter, the manufacturing method of an LED device is described with reference to FIG. 8 and FIGS. 9A, 9B, 9C and 9D together.

Referring to FIG. 8, the manufacturing method of an LED device 100 according to an embodiment includes: sequentially forming, on a substrate 1000, a first semiconductor layer 1111 of a first type, a light emitting layer 1113 emitting light and a second semiconductor layer 1115 of a second type different from the first type (S810); removing the substrate 1000 (S820); and forming a filter 120 on a portion where the substrate 1000 is removed from the first semiconductor layer 1111, the filter 120 transmitting light in a second wavelength band including a peak wavelength within a first wavelength band 310 (S830). Meanwhile, the first semiconductor layer 1111 and the second semiconductor layer 1115 illustrated in FIGS. 8, 9A, 9B, 9C and 9D are named as the first and second layers based on an order in which the semiconductor layers are generated; and the first semiconductor layer 111 and the second semiconductor layer 115 illustrated in FIGS. 1, 2, 3A, 3B, 4A, 4B, 4C, 5A, 5B, 6A, 6B, 6C, 7A and 7B described above are named as the first and second layers based on a position of the semiconductor layer in a direction from its bottom to top. The description of the second semiconductor layer 115 described above may be equally applied to the first semiconductor layer 1111 described below, and the description of the first semiconductor layer 111 described above may be equally applied to the second semiconductor layer 1115.

Figure 9A:
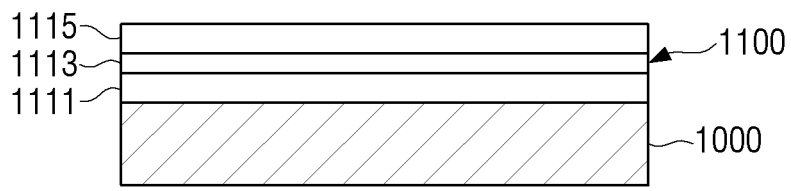
FIG. 9A is a view for describing a manufacturing method of an LED device according to an embodiment.

First, referring to FIG. 9A, the first semiconductor layer 1111 of the first type, the light emitting layer 1113 emitting light and the second semiconductor layer 1115 of the second type different from the first type may be sequentially formed on the substrate 1000 (S810).

To this end, the substrate 1000 may be provided first. Here, the substrate 1000 may be a wafer for growing the semiconductor layer. For example, the substrate 1000 may be made of a wafer such as sapphire ($Al_2SO_4$), silicon (Si), silicon carbide (SiC), gallium nitride (GaN), gallium arsenide (GaAs), gallium phosphide (GaP), zinc oxide (ZnO), etc. However, the substrate 1000 used in the disclosure is not limited to a specific material.

If the substrate 1000 is provided, as illustrated in FIG. 9A, the first semiconductor layer 1111, the light emitting layer 1113 emitting light and the second semiconductor layer 1115 may be sequentially formed on the substrate 1000 (S810). Here, the first semiconductor layer 1111 may be the first type semiconductor layer, and the second semiconductor layer 1115 may be the second type semiconductor layer different from the first type.

In detail, the first semiconductor layer 1111, the light emitting layer 1113 emitting light and the second semiconductor layer 1115 may be sequentially formed on the substrate 1000 through epitaxial growth utilizing a process technology such as metal organic vapor phase epitaxy (MOVPE), metal organic chemical vapor deposition (MOCVD) or molecular beam epitaxy (MBE). For example, if the first semiconductor layer 1111 of the first type is an n-type semiconductor layer, the second semiconductor layer 1115 of the second type may be a p-type semiconductor layer, and if the first semiconductor layer 1111 of the first type is the p-type semiconductor layer, the second semiconductor layer 1115 of the second type may be the n-type semiconductor layer.

Meanwhile, in this case, semiconductor layers of various characteristics may be additionally stacked on top surfaces or bottom surfaces of the first semiconductor layer 1111 and the second semiconductor layer 1115.

Figure 9B:
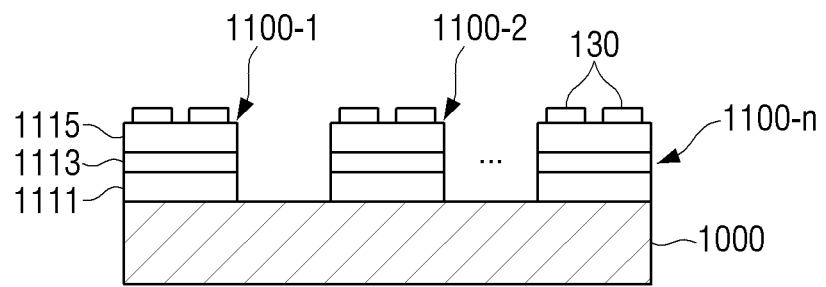
FIG. 9B is a view for describing a manufacturing method of an LED device according to an embodiment.

Next, referring to FIG. 9B, electrodes 130 may be formed to be in elect ca contact (ohmic contact) with the first semiconductor layer 1111 and the second semiconductor layer 1115 to apply an external voltage to the first semiconductor layer 1111 and the second semiconductor layer 1115. For example, the electrodes 130 may be formed on each one side of the first semiconductor layer 1111 and the second semiconductor layer 1115, respectively. In addition, a first electrode of the electrodes 130 may be formed on one side of the first semiconductor layer 1111 and a second electrode separated from the first electrode may be formed on one side of the second semiconductor layer 1115 to electrically separate (insulate) the first semiconductor layer 1111 and the second semiconductor layer 1115 from each other. The electrodes 130 may be formed by various techniques such as sputtering, evaporation, and spin coating.

To this end, the semiconductor layer 1100 formed on the substrate 1000 may be etched based on structure and size of the LED device 100. In this case, the semiconductor layer 1100 may be divided into a plurality of isolated semiconductor cells 1100-1 and 1100-2 to 1100-$n$ by etching at a predetermined interval. Here, a size of the isolated semiconductor cells may be in a range of several nanometers to several tens of micrometers. Accordingly, the inside of each of the plurality of semiconductor cells 1100-1 and 1100-2 to 1100-$n$ may be formed to have an inverted structure of a semiconductor cell 110 of the LED device 100 according to various embodiments of the disclosure illustrated in FIGS. 5A, 5B, 6A, 6B, 6C, etc. The isolation of such semiconductor cells may be achieved by various techniques such as dry etching and plasma etching.

Meanwhile, referring to FIG. 5A, the manufacturing method of the disclosure may further include forming a reflective layer 140 reflecting light emitted from the light emitting layer 1113 to a filter 120 to be formed as below on outer surfaces of the first semiconductor layer (not illustrated), the second semiconductor layer (not illustrated) and the light emitting layer (not illustrated).

In detail, the reflective layer 140 may be formed on the outer surfaces of the first semiconductor layer 1111, the second semiconductor layer 1115 and the light emitting layer 1113, included in each of the plurality of isolated semiconductor cells 1100-1 and 1100-2 to 1100-$n$. In this case, the reflective layer 140 may be formed on the outer surfaces of the first semiconductor layer 1111, the second semiconductor layer 1115 and the light emitting layer 1113 to have various angles such as 1 to 90 degrees with respect to a horizontal plane. In this case, the reflective layer 140 may be formed by techniques such as atomic layer deposition (ALD), e-beam evaporation, sputtering, and spin coating.

Figure 9C:
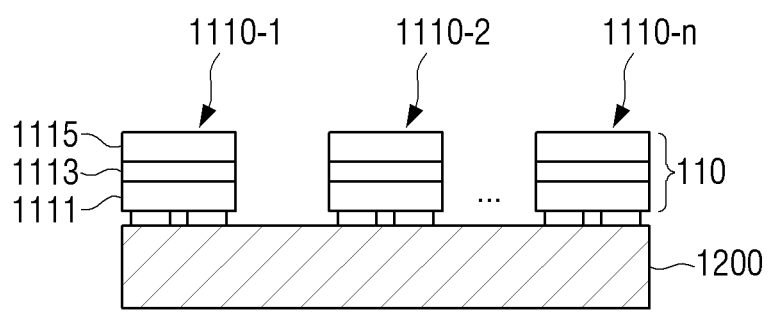
FIG. 9C is a view for describing a manufacturing method of an LED device according to an embodiment.

Next, referring to FIGS. 9B and 9C, the substrate 1000 may be removed (S820).

In detail, the substrate 1000 may be removed from the plurality of semiconductor cells 1100-1 and 1100-2 to 1100-$n$ after the semiconductor layer 1100 is isolated into the plurality of semiconductor cells 1100-1 and 1100-2 to 1100-$n$ (S820). Accordingly, the substrate 1000 may be removed by a technique known to those skilled in the art, such as laser lift off or dry or wet etching.

Then, as illustrated in FIG. 9C, the plurality of semiconductor cells 1110-1 and 1110-2 to 1110-$n$ may be transferred to a carrier substrate 1200. In this case, the plurality of semiconductor cells 1110-1 and 1110-2 to 1110-$n$ may be transferred in such a manner that the electrodes 130 are placed on the bottom surfaces of the semiconductor cells. Accordingly, the semiconductor layers respectively formed on the plurality of semiconductor cells 1100-1 and 1100-2 to 1100-$n$ may be placed from bottom to top in order of the second semiconductor layer 1115, the light emitting layer 1113 and the first semiconductor layer 1111.

Meanwhile, as illustrated in FIG. 5B, the manufacturing method of the disclosure may further include, before the forming of the filter 120, forming a color conversion layer 150 including at least one of a phosphor or a quantum dot on the first semiconductor layer 1111. Here, the color conversion layer 150 may be configured to convert a color of light emitted from the light emitting layer 113. To this end, the color conversion layer 150 may be formed between the first semiconductor layer 1111 and the filter 120 to be formed as below. A detailed content is omitted because it overlaps with the above description.

Figure 9D:
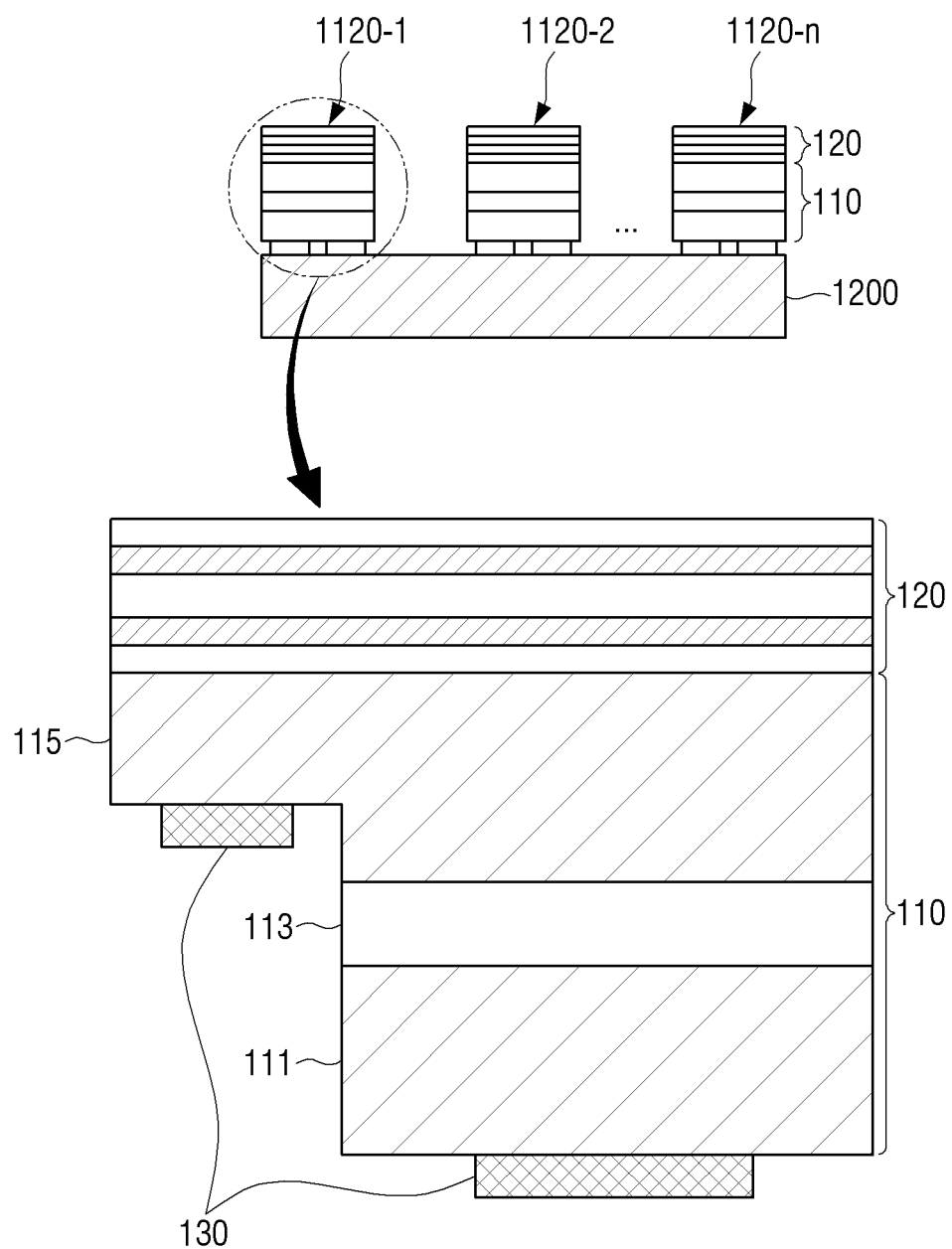
FIG. 9D is a view for describing a manufacturing method of an LED device according to an embodiment.

Next, referring to FIG. 9D, the filter 120 may be formed on a portion where the substrate 1000 is removed from the first semiconductor layer 1111 (S830), e.g., on the plurality of semiconductor cells 1120-1 and 1120-2 to 1120-$n$. Here, the filter 120 may transmit light in a second wavelength band 330 including the peak wavelength within the first wavelength band 310, and may include a plurality of first refractive layers 121 and a plurality of second refractive layers 123 having a refractive index greater than a refractive index of the first refractive layers.

In this case, the plurality of first refractive layers 121 and the plurality of second refractive layers 123 may be formed alternately with each other on the portion where the substrate 1000 is removed from the first semiconductor layer 1111. In addition, a defect layer 125 may be formed to be positioned between the plurality of first refractive layers 121 and the plurality of second refractive layers 123.

Here, the plurality of first refractive layers 121 and the plurality of second refractive layers 123 may be formed alternately with each other on one side and the other side of the defect layer 125.

In detail, the forming of the filter 120 may include: forming the plurality of first refractive layers 121 and the plurality of second refractive layers 123 alternately with each other on the first semiconductor layer 1111 in order of the first refractive layer 121 and the second refractive layer 123; forming the defect layer 125 on a topmost surface of the plurality of first refractive layers 121 and the plurality of second refractive layers 123 formed alternately with each other; and forming the plurality of first refractive layers 121 and the plurality of second refractive layers 123 alternately with each other on the defect layer 125 in order of the second refractive layer 123 and the first refractive layer 121.

For example, the plurality of first refractive layers 121, the plurality of second refractive layers 123 and the defect layer 125 may be formed on the portion where the substrate 1000 is removed from the first semiconductor layer 1111 in the same order of the first refractive layer 121, the second refractive layer 123, the defect layer 125, the second refractive layer 123 and the first refractive layer 121.

Meanwhile, a thickness of the first refractive layer 121 may be determined based on a center wavelength of the first wavelength band 310 and the refractive index of the first refractive layer 121, and a thickness of the second refractive layer 123 may be determined based on the center wavelength of the first wavelength band 310 and the refractive index of the second refractive layer 123.

Here, the first refractive layer 121 may have the refractive index of 1.0 or more and 2.0 or less, and the second refractive layer 123 may have the refractive index of 2.0 or more and 3.0 or less.

Meanwhile, a thickness of the defect layer 125 may be determined based on the center wavelength of the first wavelength band 310, the peak wavelength of the second wavelength band 330 and a refractive index of the defect layer 125.

Here, the refractive index of the defect layer 125 may be the same as the refractive index of the first refractive layer 121. In addition, the number of the first refractive layer 121 and the second refractive layer 123 formed on one side of the defect layer 125 may be the same as the number of the first refractive layer 121 and the second refractive layer 123 formed on the other side of the defect layer 125.

Meanwhile, the first wavelength band 310 may include a wavelength band corresponding to one of red, green and blue colors of light incident on the filter.

According to the various embodiments of the disclosure as described above, there may be provided the LED device capable of improving the color characteristic of light and the manufacturing method thereof.

In addition, there may be provided the LED device capable of improving color purity and color reproducibility of light and the manufacturing method thereof.

The various embodiments of the disclosure may be implemented in software including an instruction stored in a machine-readable storage medium (for example, a computer-readable storage medium). A machine may be an apparatus that invokes the stored instruction from the storage medium and may be operated depending on the invoked instruction, and may include the electronic apparatus (for example, the LED device 100) according to the disclosed embodiments. In case that the instruction is performed by a processor, the processor may perform a function corresponding to the instruction directly or using other components under a control of the processor. The instruction may include codes provided or performed by a compiler or an interpreter. The machine-readable storage medium may be provided in a form of a non-transitory storage medium. Here, the term 'non-transitory' may indicate that the storage medium is tangible without including a signal, and does not distinguish whether data are semi-permanently or temporarily stored in the storage medium.

A method according to various embodiments may be provided as being included in a computer program product. The computer program product may be traded as a product between a seller and a purchaser. The computer program product may be distributed in a form of the machine-readable storage medium (for example, a compact disc read only memory (CD-ROM)) that may be read by the machine or online through an application store (for example, PLAY-STORE™). In the case of the online distribution, at least portions of the computer program products may be at least temporarily stored or provided in a storage medium such as a memory of a server of a manufacturer, a server of an application store or a relay server.

Each of components (for example, modules or programs) according to the various embodiments may include a single entity or a plurality of entities, and some of the sub-components described above may be omitted or other sub-components may be further included in the various embodiments. Alternatively or additionally, some of the components (for example, the modules or the programs) may be integrated into one entity, and may perform functions performed by the respective components before being integrated in the same or similar manner. Operations performed by the modules, the programs or other components, according to various embodiments may be executed sequentially, in parallel, iteratively or heuristically. Alternatively, at least some of the operations may be executed in a different order or omitted, or another operation may be added thereto.

Although embodiments of the disclosure have been illustrated and described hereinabove, the disclosure is not limited to the abovementioned specific embodiments, but may be variously modified by those skilled in the art to which the disclosure pertains without departing from the gist of the disclosure as disclosed in the accompanying claims. These modifications should also be understood to fall within the scope and spirit of the disclosure.

What is claimed is:

1. A light emitting diode (LED) device comprising:
a first semiconductor layer of a first type;
a second semiconductor layer of a second type different from the first type;
a light emitting layer formed between the first semiconductor layer and the second semiconductor layer and configured to emit light based on a difference between a voltage applied to the first semiconductor layer and a voltage applied to the second semiconductor layer; and
a filter formed on the second semiconductor layer and configured to transmit light in a second wavelength band within a first wavelength band,
wherein the filter includes a defect layer, first refractive layers, and second refractive layers, each of the second refractive layers having a refractive index greater than a refractive index of each of the first refractive layers, respectively,
wherein the first refractive layers and the second refractive layers are formed alternately with each other on one side and other side of the defect layer, and
wherein the defect layer is formed of a thickness which is determined based on a center wavelength of the first wavelength band, a peak wavelength of the second wavelength band and a refractive index of the defect layer.

2. The LED device as claimed in claim 1, wherein the refractive index of the defect layer is the same as the refractive index of each of the first refractive layers.

3. The LED device as claimed in claim 1, wherein each of the first refractive layers has the refractive index between 1.0 and 2.0, and
each of the second refractive layers has the refractive index between 2.0 and 3.0.

4. The LED device as claimed in claim 1, wherein
the first refractive layers and the second refractive layers are formed alternately with each other between the second semiconductor layer and the defect layer in an order of one of the first refractive layers formed on the second semiconductor layer followed by one of the second refractive layers, and
the first refractive layers and the second refractive layers are formed alternately with each other on the defect layer in an order of one of the second refractive layers formed on the defect layer followed by one of the first refractive layers.

5. The LED device as claimed in claim 1, wherein a number of the first refractive layers and the second refractive layers formed on the one side of the defect layer is the same as a number of the first refractive layers and the second refractive layers formed on the other side of the defect layer.

6. The LED device as claimed in claim 1, wherein the first wavelength band includes a wavelength band corresponding to one of a red color, a green color, or a blue color of light incident on the filter.

7. The LED device as claimed in claim 1, wherein a thickness of the first refractive layers, respectively, is determined based on the center wavelength of the first wavelength band and the refractive index of each of the first refractive layers, and a thickness of the second refractive layers, respectively, is determined based on the center wavelength of the first wavelength band and the refractive index of each of the second refractive layers.

8. The LED device as claimed in claim 1, further comprising a color conversion layer formed between the second semiconductor layer and the filter and including at least one of a phosphor or a quantum dot.

9. The LED device as claimed in claim 1, further comprising a reflective layer formed on outer surfaces of the first semiconductor layer, the second semiconductor layer and the light emitting layer, respectively, and configured to reflect light emitted from the light emitting layer to the filter.

10. The LED device as claimed in claim 1, further comprising:

a first electrode formed on a bottom surface of the first semiconductor layer; and a second electrode electrically insulated from the first electrode and formed on a bottom surface of the second semiconductor layer.

11. A manufacturing method of a light emitting diode (LED) device including a first semiconductor layer of a first type, a second semiconductor layer of a second type different from the first type, a light emitting layer formed between the first semiconductor layer and the second semiconductor layer and configured to emit light based on a difference between a voltage applied to the first semiconductor layer and a voltage applied to the second semiconductor layer, and a filter formed on the second semiconductor layer and configured to transmit light in a second wavelength band within a first wavelength band, the manufacturing method comprising:

sequentially forming, on a substrate, the first semiconductor layer, the light emitting layer, and the second semiconductor layer;

removing the substrate; and forming the filter on a portion where the substrate is removed from the first semiconductor layer, wherein the filter includes a defect layer, first refractive layers, and second refractive layers, each of the second refractive layers having a refractive index greater than a refractive index of each of the first refractive layers, respectively, wherein the first refractive layers and the second refractive layers are formed alternately with each other on one side and other side of the defect layer, and wherein the defect layer is formed of a thickness which is determined based on a center wavelength of the first wavelength band, a peak wavelength of the second wavelength band and a refractive index of the defect layer.

12. The manufacturing method of the LED device as claimed in claim 11, wherein the refractive index of the defect layer is the same as the refractive index of each of the first refractive layers.

13. The manufacturing method of the LED device as claimed in claim 11, wherein each of the first refractive layers has the refractive index between 1.0 and 2.0, and each of the second refractive layers has the refractive index between 2.0 and 3.0.

14. The manufacturing method of the LED device as claimed in claim 11, wherein the forming the filter further comprises:

forming the first refractive layers and the second refractive layers alternately with each other on the first semiconductor layer in an order of one of the first refractive layers formed on the first semiconductor layer followed by one of the second refractive layers;

forming the defect layer on a topmost surface of the first refractive layers and the second refractive layers formed alternately with each other; and forming the first refractive layers and the second refractive layers alternately with each other on the defect layer in an order of one of the second refractive layers formed on the defect layer followed by one of the first refractive layers.

15. The manufacturing method of the LED device as claimed in claim 11, wherein a number of the first refractive layers and the second refractive layers formed on the one side of the defect layer is the same as a number of the first refractive layers and the second refractive layers formed on the other side of the defect layer.

16. The manufacturing method of the LED device as claimed in claim 11, wherein the first wavelength band includes a wavelength band corresponding to one of a red color, a green color, or a blue color of light incident on the filter.

17. The manufacturing method of the LED device as claimed in claim 11, wherein a thickness of the first refractive layers, respectively, is determined based on the center wavelength of the first wavelength band and the refractive index of each of the first refractive layers, and a thickness of the second refractive layers, respectively, is determined based on the center wavelength of the first wavelength band and the refractive index of each of the second refractive layers.

18. The manufacturing method of the LED device as claimed in claim 11, further comprising, before the forming of the filter, forming a color conversion layer including at least one of a phosphor or a quantum dot on the first semiconductor layer.

19. The manufacturing method of the LED device as claimed in claim 11, further comprising forming a reflective layer configured to reflect light emitted from the light emitting layer to the filter on outer surfaces of the first semiconductor layer, the second semiconductor layer and the light emitting layer, respectively.

20. The manufacturing method of the LED device as claimed in claim 11, further comprising:

forming a first electrode on a top surface of the first semiconductor layer; and forming a second electrode on a top surface of the second semiconductor layer.

* * * * *